(12) United States Patent
Uemichi et al.

(10) Patent No.: US 8,154,360 B2
(45) Date of Patent: Apr. 10, 2012

(54) RESIN MULTILAYER DEVICE AND METHOD FOR MANUFACTURING SAME

(75) Inventors: Yusuke Uemichi, Sakura (JP); Takuya Aizawa, Sakura (JP); Osamu Nakao, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/102,710

(22) Filed: May 6, 2011

(65) Prior Publication Data

US 2011/0210804 A1 Sep. 1, 2011

Related U.S. Application Data

(63) Continuation of application No. PCT/JP2009/006097, filed on Nov. 13, 2009.

(30) Foreign Application Priority Data

Nov. 14, 2008 (JP) ................................. 2008-292687

(51) Int. Cl.
H03H 7/42 (2006.01)
H01P 3/08 (2006.01)

(52) U.S. Cl. .......................................... 333/26; 333/238

(58) Field of Classification Search .................... 333/25, 333/26, 238
See application file for complete search history.

(56) References Cited

U.S. PATENT DOCUMENTS

| | | | |
|---|---|---|---|
| 4,755,775 A * | 7/1988 | Marczewski et al. ............ 333/26 |
| 5,025,232 A * | 6/1991 | Pavio ................................ 333/26 |
| 5,497,137 A * | 3/1996 | Fujiki ............................ 336/200 |
| 6,150,897 A | 11/2000 | Nishikawa et al. |
| 7,176,776 B1 * | 2/2007 | Tantwai et al. ................ 336/200 |
| 7,471,167 B2 * | 12/2008 | Kim et al. ........................ 333/26 |
| 2009/0134950 A1 | 5/2009 | Kimura et al. |

FOREIGN PATENT DOCUMENTS

| JP | 8-191016 A | 7/1996 |
|---|---|---|
| JP | 10-335911 A | 12/1998 |
| JP | 2002-050910 A | 2/2002 |
| JP | 2002-299127 A | 10/2002 |
| JP | 2003-008312 A | 1/2003 |
| JP | 2003-018039 A | 1/2003 |
| JP | 2003-168948 A | 6/2003 |
| JP | 2004-172284 A | 6/2004 |
| JP | 2004-350143 A | 12/2004 |

(Continued)

OTHER PUBLICATIONS

Yeong J. Yoon, et al., "Design and Characterization of Multilayer Spiral Transmission-Line Baluns", IEEE Transactions on Microwave Theory and Techniques, Sep. 1999, pp. 1841-1847, vol. 47, No. 9.

Primary Examiner — Dean O Takaoka
(74) Attorney, Agent, or Firm — Sughrue Mion, PLLC

(57) ABSTRACT

Provided is a resin multilayer device having a balun, wherein the resin multilayer device comprises: a substrate; a first resin layer formed on the substrate; two balanced signal transmission lines that are electrically independently disposed on the first resin layer; a second resin layer formed on the two balanced signal transmission lines and the first resin layer; an unbalanced signal transmission line disposed on the second resin layer and facing the two balanced signal transmission lines; and a third resin layer formed on the unbalanced signal transmission line and the second resin layer.

14 Claims, 28 Drawing Sheets

FOREIGN PATENT DOCUMENTS

| | | |
|---|---|---|
| JP | 2005-108929 A | 4/2005 |
| JP | 2005-130376 A | 5/2005 |
| JP | 2005-244848 A | 9/2005 |
| JP | 2005-348054 A | 12/2005 |
| JP | 2006-121313 A | 5/2006 |
| JP | 2007-104102 A | 4/2007 |
| JP | 2007-281929 A | 10/2007 |
| JP | 2008-016703 A | 1/2008 |

* cited by examiner

US 8,154,360 B2

RESIN MULTILAYER DEVICE AND METHOD FOR MANUFACTURING SAME

CROSS REFERENCE TO RELATED APPLICATIONS

This application is a continuation application based on a PCT Patent Application No. PCT/JP2009/006097, filed Nov. 13, 2009, whose priority is claimed on Japanese Patent Application No. 2008-292687, filed Nov. 14, 2008, the entire content of which are hereby incorporated by reference.

BACKGROUND OF THE INVENTION

1. Field of the Invention

The present invention relates to a resin multilayer device including a balun (balance-unbalance transformer) for use in a wireless circuit and the like. Specifically, the present invention relates to a resin multilayer device including a stack-type balun formed by use of the Wafer Level Chip Size/Scale Package (WLCSP) technology.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Baluns are circuits in which two balanced signal transmission lines and one unbalanced signal transmission line are arranged in proximity via a dielectric layer to produce electromagnetic coupling between the balanced signal transmission lines and the unbalanced signal transmission line. Baluns convert unbalanced signals (single-ended signals) that have been input to the unbalanced signal transmission line into balanced signals (differential signals), and outputs them from the balanced signal transmission lines. Alternatively, in a manner reverse to this, baluns convert balanced signals that have been input to the balanced signal transmission lines into unbalanced signals and outputs them from the unbalanced signal transmission line.

A first end of the unbalanced signal transmission line is an input/output end for unbalanced signals (single-ended signals), and a second end of it is an open end. First ends of the two balanced signal transmission lines are input/output ends for balanced signals (differential signals), and second ends of them are ground ends, which are connected to the GND.

Stack-type baluns have a configuration in which an unbalanced signal transmission line and two balanced signal transmission lines are stacked via an insulative layer or a dielectric layer. Manufacturing methods of stack-type balun apparatuses include one based on the Low Temperature Co-fired Ceramics (LTCC) technique (for example, see Patent Documents 1 to 3), one based on the manufacturing method of multilayer printed wiring boards (for example, see Patent Document 4), one based on the semiconductor process technology (for example, see Patent Document 5, and Non-Patent Document 1), and one using a resin layer as a dielectric layer (for example, see Patent Documents 6 and 7).

Baluns also function as transformers for converting impedance. For impedance conversion, they are required to be designed so that the input impedance value on the unbalanced signal side (the single-ended signal input side) and the output impedance value on the balanced signal side (the differential signal output side) have a predetermined relationship. As representative values, the input impedance value on the unbalanced signal side (the single-ended signal input side) is 50Ω, and the output impedance value on the balanced signal side (the differential signal output side) is 50Ω, 100Ω, 150Ω, 200Ω or the like.

Parameters for satisfying these impedance specifications are: a width of the transmission lines; a thickness of the transmission lines; a thickness of the insulative layer between the transmission lines (namely, a distance between the transmission lines) and its dielectric constant; a thickness and a dielectric constant of the insulative layer on the lower side of the lower transmission line; and a thickness and a dielectric constant of the insulative layer on the upper side of the upper transmission line (for example, see Patent Document 4).

On the other hand, in these years, a technique called Wafer Level Chip Size/Scale Package (WLCSP) has been proposed (for example, see Patent Documents 8 to 10). The WLCSP is a technology in which a redistribution layer is formed on a wafer by the resin layer formation process and the fabrication process of thick-film Cu interconnection lines or other interconnection lines, followed by dicing into chips. Namely, it is a manufacturing method covering the steps to packaging while chips are in the wafer form. Note that the package manufactured by the WLCSP technology is called a Wafer Level Package (WLP).

CITATION LIST

Patent Document 1: Japanese Unexamined Patent Application, First Publication, No. 2002-050910
Patent Document 2: Japanese Unexamined Patent Application, First Publication, No. 2003-008312
Patent Document 3: Japanese Unexamined Patent Application, First Publication, No. 2002-299127
Patent Document 4: Japanese Unexamined Patent Application, First Publication, No. 2006-121313
Patent Document 5: Japanese Unexamined Patent Application, First Publication, No. 2004-172284
Patent Document 6: Japanese Unexamined Patent Application, First Publication, No. 2005-130376
Patent Document 7: Japanese Unexamined Patent Application, First Publication, No. 2005-244848
Patent Document 8: Japanese Unexamined Patent Application, First Publication, No. 2005-108929
Patent Document 9: Japanese Unexamined Patent Application, First Publication, No. 2007-281929
Patent Document 10: Japanese Unexamined Patent Application, First Publication, No. 2008-016703
Non-Patent Document 1: Yeong J. Yoon, "Design and characterization of Multilayer Spiral Transmission-Line Baluns," IEEE TRANSACTIONS ON MICROWAVE THEORY AND TECHNIQUES, VOL. 47, No. 9, September, 1999

SUMMARY

However, in the balun apparatus manufactured by a method based on the LTCC technology in which a plurality of ceramic plates are stacked and fired, the dimension between the transmission lines and the GND layer as well as the dimension between the transmission lines is fixed to a specific value, and hence is not allowed to be changed continuously. This prevents easy adjustment and change of electromagnetic coupling between the transmission lines. Therefore, to adjust the design value of the impedance value or change the design of the impedance value, there is no other choice but to change the width of the transmission lines. In this method, however, only a slight adjustment change is allowed. In addition, there is a problem in that an adjustment change in impedance value is not available with ease. Furthermore, a plurality of layers including a GND layer and a layer for signal input is required, leading to a problem of complicated structure and manufacturing procedure. Furthermore, the positioning accuracy between the lower transmission line and the upper transmission line is low, leading to a problem in that the impedance value is deviated from the design value.

Moreover, the balun apparatuses manufactured based on the aforementioned multilayer printed wiring board manufacturing technology are highly restricted in dimensions, which makes it not easy to adjust the electromagnetic coupling. This results in a problem in that an adjustment change in impedance value is not available with ease. Furthermore, because transmission lines are formed in the printed wiring board, fine processing is not allowed, leading to a problem of increased size. Moreover, because processing with high accuracy is not available, positioning accuracy between the lower transmission line and the upper transmission line is low, leading to a problem in that the impedance value is deviated from the design value.

Furthermore, in the balun apparatuses manufactured based on the aforementioned semiconductor process technology, fine processing and high-accuracy processing are available. However, resistance in interconnection lines is increased, leading to an increased insertion loss.

Furthermore, an insertion loss is increased also from the influence of silicon (Si) substrate. To be more specific, the insertion loss (attenuation of signals) has a very bad value of 5 dB or less. Therefore, it is not possible to make a CMOS-stack-type balun monolithic, leading to a problem in that there is no other choice but to use the balun as a single component.

The present invention has been achieved in order to solve such conventional problems, and has an object to provide a resin multilayer device having a balun that is capable of actualizing a highly accurate impedance and a low insertion loss. Moreover, the present invention has an object to provide a manufacturing method of a resin multilayer device having a balun that is not only capable of actualizing a highly accurate impedance and a low insertion loss but also is capable of adjusting a change in impedance with ease and of being manufactured in a simplified manner.

A first aspect of the present invention is a resin multilayer device, including: a substrate; a first resin layer formed on the substrate; a first second balanced signal transmission line and a second balanced signal transmission line that are formed electrically independently on the first resin layer; a second resin layer formed on the first and second balanced signal transmission lines and the first resin layer; an unbalanced signal transmission line formed on the second resin layer so as to be opposed to the first and second balanced signal transmission lines; and a third resin layer formed on the unbalanced signal transmission line and the second resin layer, in which the first balanced signal transmission line has a first signal input/output end and a first ground end, the second balanced signal transmission line has a second signal input/output end and a second ground end, and the unbalanced signal transmission line has a signal input/output end and an open end.

A second aspect of the present invention is the resin multilayer device according to the first aspect of the present invention, further including a first GND layer that is formed on the substrate and is located beneath the first resin layer.

A third aspect of the present invention is the resin multilayer device according to the first aspect of the present invention, further including a first GND layer that is formed beneath the substrate.

A fourth aspect of the present invention is the resin multilayer device according to the first aspect of the present invention, further including a first GND layer that is located beside the first and second balanced signal transmission lines and the unbalanced signal transmission line.

A fifth aspect of the present invention is the resin multilayer device according to any one of the second, third, and fourth aspects of the present invention, further including a second GND layer that is formed on the third resin layer.

A sixth aspect of the present invention is the resin multilayer device according to any one of the second, third, and fourth aspects of the present invention, in which the substrate is a semiconductor substrate in which an IC is fabricated, and the ground ends of the first and second balanced signal transmission lines are connected to the first GND layer.

A seventh aspect of the present invention is the resin multilayer device according to any one of the second, third, and fourth aspects of the present invention, further including: a first, second, third, fourth, and fifth opening portions formed in the third resin layer; a first solder bump that is formed in the first opening portion and is electrically connected to the signal input/output end of the first balanced signal transmission line; a second solder bump that is formed in the second opening portion and is electrically connected to the signal input/output end of the second balanced signal transmission line; a third solder bump that is formed in the third opening portion and is electrically connected to the signal input/output end of the unbalanced signal transmission line; a fourth solder bump that is formed in the fourth opening portion and is electrically connected to the ground end of the first balanced signal transmission line; and a fifth solder bump that is formed in the fifth opening portion and is electrically connected to the ground end of the second balanced signal transmission line.

An eighth aspect of the present invention is the resin multilayer device according to any one of the second, third, and fourth aspects of the present invention, in which each of the first and second balanced signal transmission lines is arranged in a spiral shape.

A ninth aspect of the present invention is the resin multilayer device according to any one of the second, third, and fourth aspects of the present invention, in which each of the first and second balanced signal transmission lines is arranged in a meander shape.

A tenth aspect of the present invention is the resin multilayer device according to any one of the second, third, and fourth aspects of the present invention, in which the first and second balanced signal transmission lines and the unbalanced signal transmission line are formed of bright plating.

An eleventh aspect of the present invention is the resin multilayer device according to any one of the second, third, and fourth aspects of the present invention, in which a window is formed in the first GND layer in a region above an inductor included in the substrate.

A twelfth aspect of the present invention is the resin multilayer device according to any one of the second, third, and fourth aspects of the present invention, in which the first and second balanced signal transmission lines are formed in recess portions that are formed in the first resin layer.

A thirteenth aspect of the present invention is the resin multilayer device according to any one of the second, third, and fourth aspects of the present invention, in which the unbalanced signal transmission line is formed in a recess portion that is formed in the second resin layer.

A fourteenth aspect of the present invention is the resin multilayer device according to the twelfth aspect, in which the unbalanced signal transmission line is arranged so as to have less overlapped area with the first and second balanced signal transmission lines.

A fifteenth aspect of the present invention is a manufacturing method of a resin multilayer device having a balun, including the steps of: forming a GND layer on a wafer to be a substrate, coating a fluid resin on the GND layer, and curing the fluid resin to form a first resin layer; providing a first balanced signal transmission line and a second balanced signal transmission line that are formed electrically independently on the first resin layer; coating a fluid resin on the first resin layer and the first and second balanced signal transmission lines, and curing the fluid resin to form a second resin layer; providing an unbalanced signal transmission line on the second resin layer so as to be opposed to the first and second balanced signal transmission lines; and forming a third resin layer on the second resin layer and the unbalanced signal transmission line.

A sixteenth aspect of the present invention is a manufacturing method of a resin multilayer device having a balun, including the steps of: forming a GND layer on a wafer to be a substrate, and spreading a photosensitive resin on the GND layer to form a first resin layer; forming a recess portion in an upper portion of the first resin layer by photolithography; forming a seed layer on the first resin layer by sputtering; forming a resist on a portion of the seed layer outside the recess portion; forming a lower interconnection line in the recess portion by a plating treatment; removing the resist; removing the seed layer by etching; forming a second resin layer on the first resin layer; forming an upper interconnection line on the second resin layer; and forming a third resin layer on the second resin layer.

A seventeenth aspect of the present invention is the manufacturing method of a resin multilayer device according to the sixteenth aspect, further including a step of forming a metal layer by sputtering.

An eighteenth aspect of the present invention the resin multilayer device according to the first aspect, in which the substrate is a semiconductor substrate in which an IC is fabricated, and the ground ends of the first and second balanced signal transmission lines are electrically connected to a GND layer of the IC.

A nineteenth aspect of the present invention is the resin multilayer device according to the first aspect, in which each of the first and second balanced signal transmission lines is arranged in a spiral shape.

A twentieth aspect of the present invention is the resin multilayer device according to the first aspect, in which each of the first and second balanced signal transmission lines is arranged in a meander shape.

A twenty-first aspect of the present invention is the resin multilayer device according to the first aspect, in which the first and second balanced signal transmission lines and the unbalanced signal transmission line are formed of bright plating.

A twenty-second aspect of the present invention is a manufacturing method of a resin multilayer device having a balun, including the steps of: coating a fluid resin on a wafer to be a substrate, and curing the fluid resin to form a first resin layer; providing a first balanced signal transmission line and a second balanced signal transmission line that are formed electrically independently on the first resin layer; coating a fluid resin on the first resin layer and the first and second balanced signal transmission lines, and curing the fluid resin to form a second resin layer; providing an unbalanced signal transmission line on the second resin layer so as to be opposed to the first and second balanced signal transmission lines; and forming a third resin layer on the second resin layer and the unbalanced signal transmission line.

According to the present invention, there is provided a WLP having a balun in which a first resin layer, two balanced signal transmission lines, a second resin layer, an unbalanced signal transmission line, and a third resin layer are stacked on a substrate in this order. Therefore, with the WLCSP technology, it is possible to resin layers and low-resistant transmission lines made of copper plating or the like, with accuracy as high as that by the CMOS semiconductor process technology. Therefore, it is possible to actualize a highly accurate impedance, and also to form a thick first resin layer. Consequently, it is advantageously possible to obtain, for example, a balun with a reduced influence from the Si substrate and with a low insertion loss can be obtained. Furthermore, it is advantageously possible to make the balun monolithic in the case where an IC is formed in the substrate.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated herein for explanatory purposes.

First Embodiment

Figure 1:
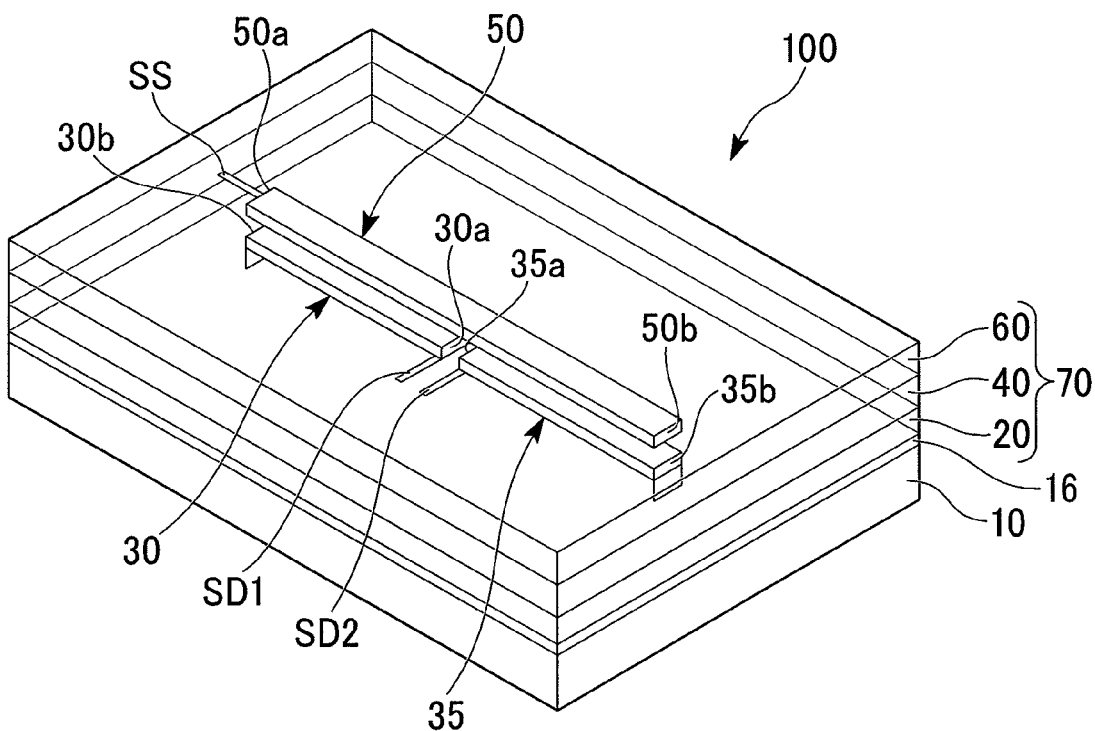
FIG. 1 is a perspective view showing an exemplary structure of a resin multilayer device according to a first embodiment of the present invention.

FIG. 1 is a perspective view schematically showing an exemplary structure of a resin multilayer device 100 according to a first embodiment of the present invention.

The resin multilayer device 100 according to the first embodiment is a WLP, including: a substrate 10; a GND layer 16; a first resin layer 20; a first balanced signal transmission line 30 and a second balanced signal transmission line 35; a second resin layer 40; a single, unbalanced signal transmission line 50; and a third resin layer 60.

In the resin multilayer device 100, the first resin layer 20, the balanced signal transmission lines 30, 35, the second resin layer 40, the unbalanced signal transmission line 50, the third resin layer 60 constitutes a stack-type balun. Furthermore, the first resin layer 20, the second resin layer 40, and the third resin layer 60 constitute a multilayer resin body 70.

Substrate 10

The substrate 10 is, for example, a semiconductor substrate such as a silicon (Si) substrate, a glass substrate, or an insulative substrate such as a GaAs substrate. Nan IC is fabricated in the substrate 10 by the CMOS semiconductor process or the like, then the resin multilayer device 100 is a WLP in which a balun is made monolithic.

First Resin Layer 20, Second Resin Layer 40, and Third Resin Layer 60

Figure 2:
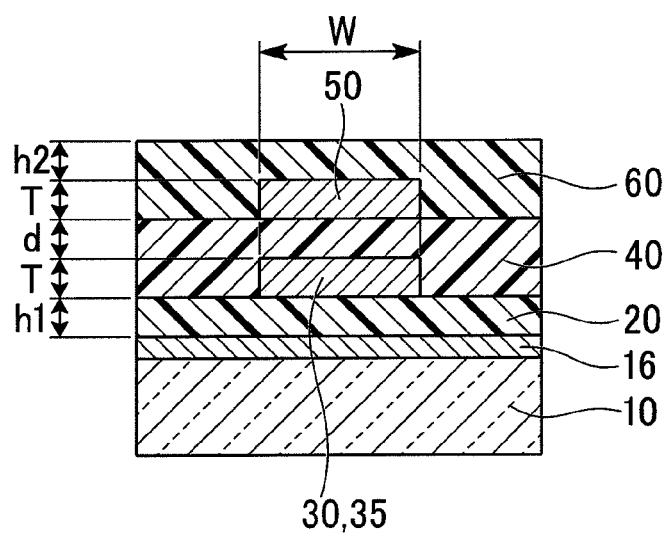
FIG. 2 is a cross-sectional view of the resin multilayer device of FIG. 1, when seen in a width direction of transmission lines.
Figure 3:
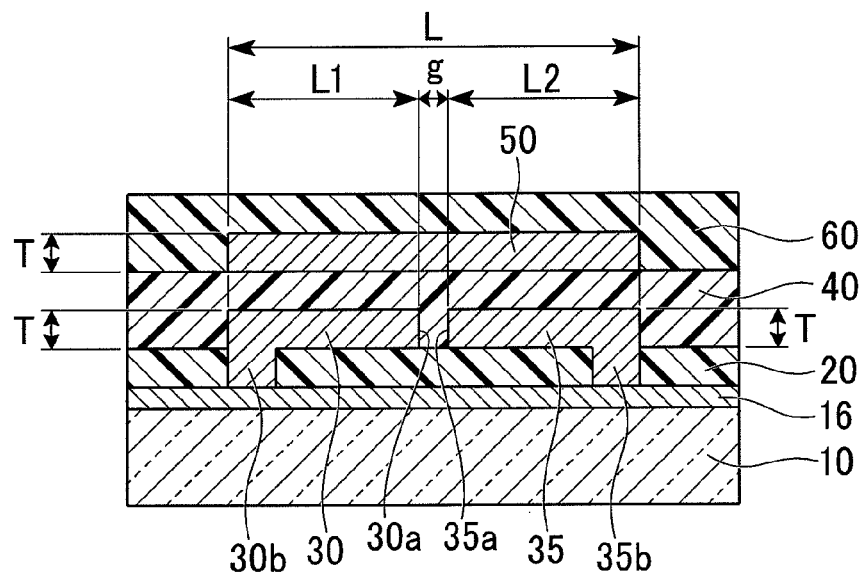
FIG. 3 is a cross-sectional view of the resin multilayer device of FIG. 1, when seen in a length direction of the transmission lines.

FIG. 2 is a cross-sectional view of the resin multilayer device 100, when seen in a width direction of the transmission lines. The GND layer 16 is formed on the substrate 10. Furthermore, the first resin layer 20 is formed on the GND layer 16. FIG. 3 is a cross-sectional view of the resin multilayer device 100, when seen in a length direction of the transmission lines.

Figure 4:
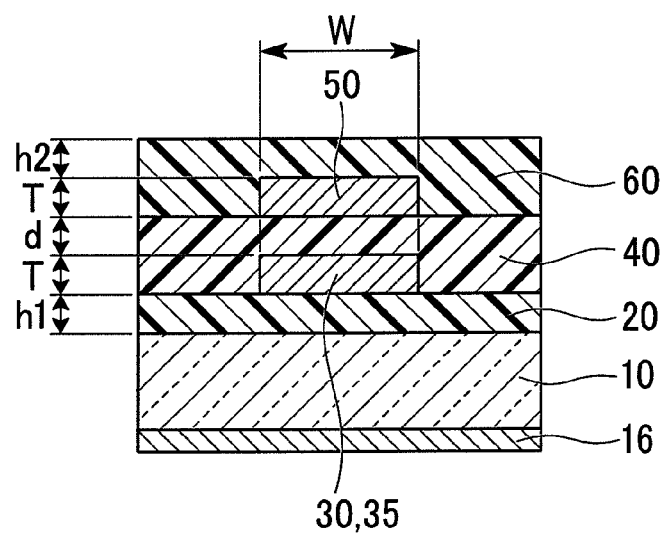
FIG. 4 is a cross-sectional view showing the resin multilayer device of FIG. 1 when seen in the width direction of the transmission lines in the case where a GND layer is formed beneath a substrate.

If the substrate 10 is an insulative substrate, the GND layer 16 may be formed beneath the substrate 10. FIG. 4 is a cross-sectional view of the resin multilayer device 100, when seen in the width direction of the transmission lines, in the case where the GND layer 16 is formed beneath the substrate 10. The GND layer 16 is formed beneath the substrate 10. Furthermore, the first resin layer 20 is formed on the substrate 10.

For the first resin layer 20, a polyimide resin, an epoxy resin, a fluorine-based resin such as ethylene tetrafluoride, or a photosensitive resin such as BCB (benzocyclobutene) is used. The first balanced signal transmission line 30 and the second balanced signal transmission line 35 are formed on the first resin layer 20.

The second resin layer 40 is formed on the first resin layer 20. For the second resin layer 40, a polyimide resin, an epoxy resin, a fluorine-based resin such as ethylene tetrafluoride, or a photosensitive resin such as BCB (benzocyclobutene) is used. The unbalanced signal transmission line 50 is formed on the second resin layer 40.

The third resin layer 60 is formed on the second resin layer 40. For the third resin layer 60, a polyimide resin, an epoxy resin, a fluorine-based resin such as ethylene tetrafluoride, or a photosensitive resin such as BCB (benzocyclobutene) is used.

It is desirable that the first resin layer 20, the second resin layer 40, and the third resin layer 60 be formed to have the same relative permittivity Er by use of the same material and the same method or the like.

Balanced Signal Transmission Lines 30, 35, and Unbalanced Signal Transmission Line 50

The first balanced signal transmission line 30 and the second balanced signal transmission line 35 are formed on the first resin layer 20. The first balanced signal transmission line 30 is a straight transmission line without a bend and a curve. Similarly, the second balanced signal transmission line 35 is a straight transmission line without a bend and a curve. The first balanced signal transmission line 30 and the second balanced signal transmission line 35 are arranged so as to be coaxial in the longitudinal direction.

A first end 30a of the first balanced signal transmission line 30 and a first end 35a of the second balanced signal transmission line 35 face each other with a gap g (see FIG. 3). The first end 30a of the first balanced signal transmission line 30 and the first end 35a of the second balanced signal transmission line 35 are signal input/output ends for balanced signals (differential signals) SD1, SD2, respectively. A second end 30b of the first balanced signal transmission line 30 and a second end 35b of the second balanced signal transmission line 35 are ground ends, which are connected to the GND layer.

The first balanced signal transmission line 30 and the second balanced signal transmission line 35 are simultaneously formed with the same metal material, for example, a plated metal such as copper plating. Furthermore, it is desirable that a transmission line length L1 of the first balanced signal transmission line 30 and a transmission line length L2 of the second balanced signal transmission line 35 be formed so as to be the same (L1=L2).

Furthermore, it is desirable that the first balanced signal transmission line 30 and the second balanced signal transmission line 35 be formed so as to have the same width W and the same thickness T. Note that a distance between the upper surface of the GND layer 16 and the lower surfaces of the first balanced signal transmission line 30 and the second balanced signal transmission line 35, namely, the thickness of the first resin layer 20, is denoted by h1 (see FIG. 2).

The unbalanced signal transmission line 50 is formed on the second resin layer 40. The unbalanced signal transmission line 50 is a straight transmission line without a bend and a curve, which is formed so as to be opposed to the upper surfaces of the first balanced signal transmission line 30 and the second balanced signal transmission line 35.

The first end 50a of the unbalanced signal transmission line 50 is a signal input/output end for an unbalanced signal SS. The second end 50b of the unbalanced signal transmission line 50 is an open end.

The unbalanced signal transmission line 50 is made of a plated metal such as copper plating. It is desirable that the unbalanced signal transmission line 50 be formed with the same metal material and by the same formation method as those for the first balanced signal transmission line 30 and the second balanced signal transmission line 35.

It is desirable that the unbalanced signal transmission line 50 be formed so that its length L is the same as the sum total of the transmission line length L1 of the balanced signal transmission line 30, the transmission line length L2 of the balanced signal transmission line 35, and the gap g between the signal input/output end 30a of the balanced signal transmission line 30 and the signal input/output end 35a of the balanced signal transmission line 35 (see FIG. 3). In general, the unbalanced signal transmission line 50 has the same width W and the same thickness T as those of the first balanced signal transmission line 30 and the second balanced signal transmission line 35. However, even if the two values are different to some degree, the operation of the balun itself is not affected (see FIG. 2).

Note that the distance between the lower surface of the unbalanced signal transmission line 50 and the upper surfaces of the first balanced signal transmission line 30 and the second balanced signal transmission line 35, which are arranged opposed to each other via the second resin layer 40, is denoted by d. The distance from the upper surface of the unbalanced signal transmission line 50 to the upper surface of the third resin layer 60 is denoted by h2 (see FIG. 2). The first resin layer 20, the second resin layer 40, and the third resin layer 60 may be different in thickness from one another. To be more specific, the first resin layer 20 may be thicker than the second resin layer 40, and the second resin layer 40 may be thicker than the third resin layer 60. The relation among a distance h1 between the lower surfaces of the first balanced signal transmission line 30 as well as the second balanced signal transmission line 35 and the upper surface of the GND layer 16 or the substrate 10, a distance d between the lower surface of the unbalanced signal transmission line 50 and the upper surfaces of the first balanced signal transmission line 30 and the second balanced signal transmission line 35, and a distance h2 between the upper surface of the unbalanced signal transmission line 50 and the upper surface of the third resin layer 60 may be h1>d>h2. For example, in the case where the conductors are made of a polyimide resin with a relative permittivity of 2.9, the balun can be made with h1=10 µm, d=8 µm, h2=6 µm, and W=25 µm.

Operation of Balun

Figure 5:
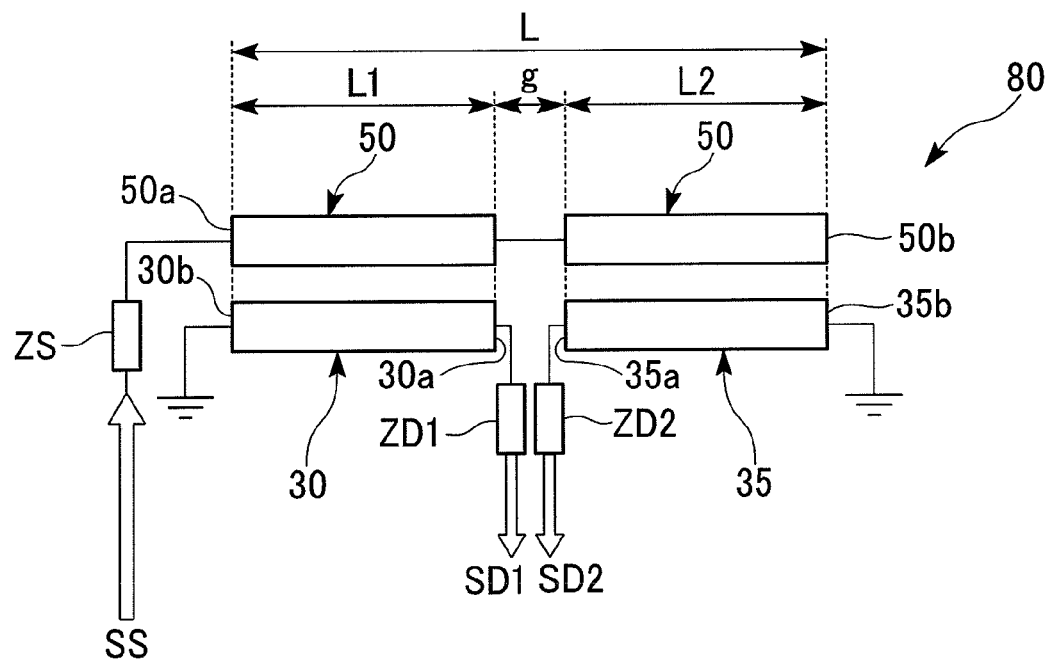
FIG. 5 is a schematic circuit diagram for explaining an operation of a stack-type balun formed in the resin multilayer device of FIG. 1.

FIG. 5 is a schematic circuit diagram for explaining an operation of a stack-type balun 80 formed in the resin multilayer device 100. In FIG. 5, to a signal input/output end 50a of an unbalanced signal transmission line 50, an unbalanced signal (a single-ended signal) SS is input. From a signal input/output end 30a of the first balanced signal transmission line 30 and a signal input/output end 35a of the second balanced signal transmission line 35, balanced signals (differential signals) SD1, SD2 are output, respectively. A reference symbol ZS denotes an input impedance of the unbalanced signal transmission line 50. Reference symbols ZD1, ZD2 denote output impedances of balanced signal transmission lines 30, 35, respectively.

In FIG. 5, the balun 80 is a circuit in which the first balanced signal transmission line 30 and the second balanced signal transmission line 35 are arranged close to the unbalanced signal transmission line 50 via a second resin layer 40 (see FIG. 1), to thereby generate electromagnetic coupling between the first balanced signal transmission line 30 as well as the second balanced signal transmission line 35 and the unbalanced signal transmission line 50. When an unbalanced signal (a single-ended signal) SS is input to a signal input/output end 50a of the unbalanced signal transmission line 50, the balun 80 converts the unbalanced signal SS to balanced signals (differential signals) SD1, SD2, and outputs them from a signal input/output end 30a of the first balanced signal transmission line 30 and a signal input/output end 35a of the second balanced signal transmission line 35, respectively. Reversely to this, when balanced signals SD1, SD2 are input respectively to the signal input/output end 30a of the first balanced signal transmission line 30 and the signal input/output end 35a of the second balanced signal transmission line 35, the balun 80 converts the balanced signals SD1, SD2 to an unbalanced signal SS and outputs it from the signal input/output end 50a of the unbalanced signal transmission line 50.

Here, let the wavelength of the signal to be transmitted (the signal to be converted) be $\lambda$, the transmission lines 30, 35, and 50 are formed so that a transmission line length L1 of the balanced signal transmission line 30 and a transmission line length L2 of the balanced signal transmission line 35 are $\lambda/4$, and that a transmission line length formed by the portions of the unbalanced signal transmission line 50 along the first balanced signal transmission line 30 and the second balanced signal transmission line 35 (=L−g) is $\lambda/2$. Alternatively, the transmission lines 30, 35, and 50 may be formed so that L1=L2<$\lambda/4$, L−g<$\lambda/2$, and the like.

Such a balun is an indispensable circuit in wireless telecommunication devices such as mobile phones that require conversion of unbalanced signals received by the antenna to balanced signals when the unbalanced signals are demodulated, and also require conversion of modulated signals, which are balanced signals, to unbalanced signals when the modulated signals are transmitted from the antenna.

In addition, the balun 80 of FIG. 5 also functions as a transformer that converts impedance values. For impedance conversion, the input impedance ZS on the unbalanced signal side (input side of single-ended signals), and the output impedances ZD1, ZD2 on the balanced signal side (output side of differential signal) are required to be impedance values conforming to the design specifications. For example, the input impedance value ZS=50Ω on the unbalanced signal side, and the output impedance values ZD1+ZD2=100, 150, 200Ω on the balanced signal side.

In the wireless telecommunication devices such as mobile phones, the input/output impedance value of the modem circuit and the output impedance value of the antenna do not always match each other. Therefore, also in order to match the impedance values of the two, the balun with a function of impedance conversion is indispensable. If no balun is inserted between the two or if the input/output impedance value is deviated from the design value of the balun even though a balun is inserted, there arises an inconvenience in which another impedance converter is required.

Manufacturing Procedure

Figure 6:
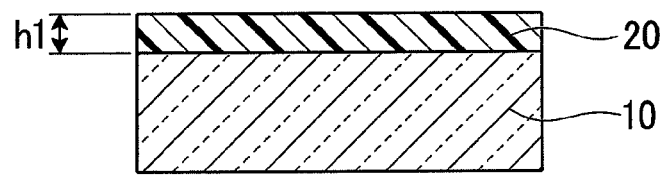
FIG. 6 is a cross-sectional view for explaining a manufacturing method of the resin multilayer device of FIG. 1, when seen in the width direction of the transmission lines.
Figure 7:
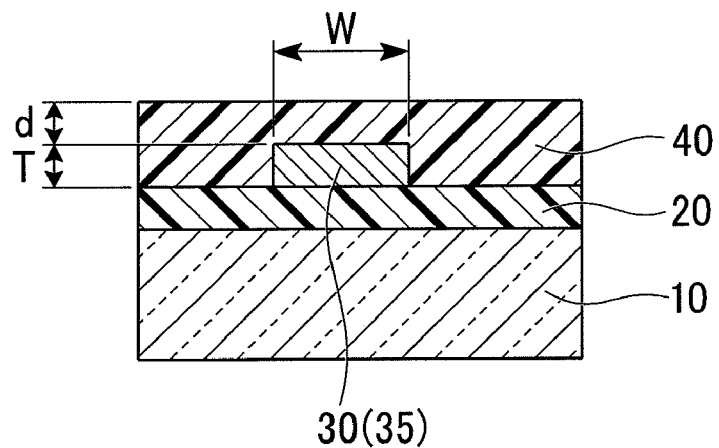
FIG. 7 is a cross-sectional view of the resin multilayer device of FIG. 1, when seen in the width direction of the transmission lines, for explaining the manufacturing method of the resin multilayer device of FIG. 1.
Figure 8:
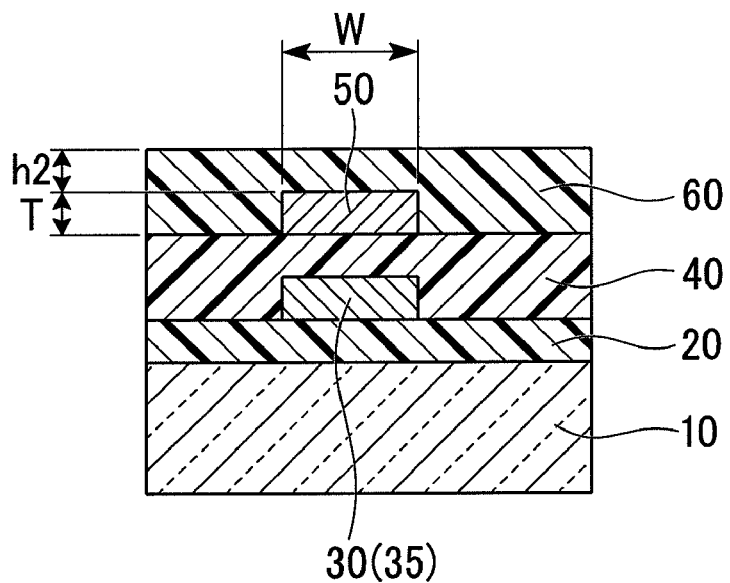
FIG. 8 is a cross-sectional view of the resin multilayer device of FIG. 1, when seen in the width direction of the transmission lines, for explaining the manufacturing method of the resin multilayer device of FIG. 1.
Figure 9:
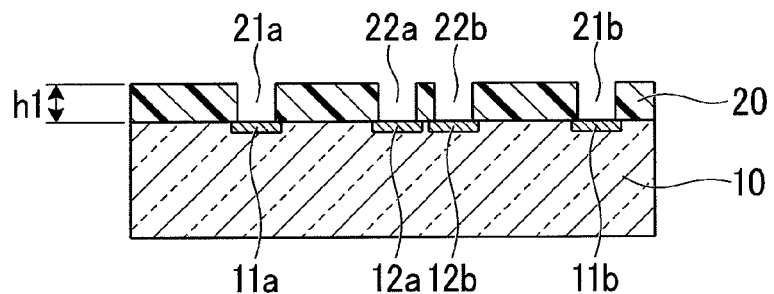
FIG. 9 is a cross-sectional view of the resin multilayer device of FIG. 1, when seen in a length direction of the transmission lines, for explaining the manufacturing method of the resin multilayer device of FIG. 1.
Figure 10:
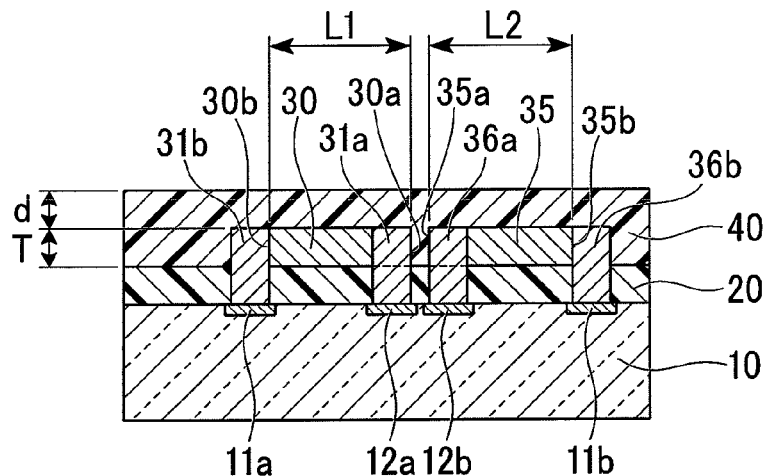
FIG. 10 is a cross-sectional view of the resin multilayer device of FIG. 1, when seen in the length direction of the transmission lines, for explaining the manufacturing method of the resin multilayer device of FIG. 1.
Figure 11:
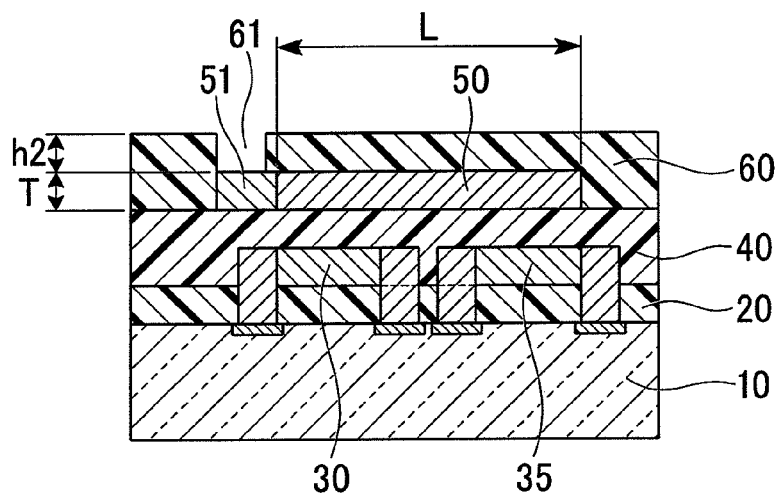
FIG. 11 is a cross-sectional view of the resin multilayer device of FIG. 1, when seen in the length direction of the transmission lines, for explaining the manufacturing method of the resin multilayer device of FIG. 1.

FIG. 6 to FIG. 8 are cross-sectional views for explaining a manufacturing procedure of the resin multilayer device 100, when seen in a width direction of the transmission lines. FIG. 9 to FIG. 11 are cross-sectional views for explaining the manufacturing procedure of the resin multilayer device 100, when seen in a length direction of the transmission lines. However, FIG. 6 to FIG. 11 are for explaining a procedure of forming a balun on a GND layer 16 on a substrate 10 out of the whole manufacturing procedure of the resin multilayer device 100.

In the following description, the substrate 10 is a silicon (Si) wafer in which an IC is fabricated by the CMOS process or the like. Because the resin multilayer device 100 is a WLP, a balun is formed by the WLCSP technology (the technology in which a redistribution layer is fabricated onto a wafer by the resin layer formation process and the formation process of interconnection lines such as thick copper interconnection lines, followed by being diced into chips).

The GND layer 16 is formed on the substrate 10 by sputtering of A1 or the like in the CMOS process or the like.

First, as shown in FIG. 6 and FIG. 9, a first resin layer 20 is formed on the substrate 10, which is a silicon wafer. In the first resin layer 20, there are provided opening portions 21a, 21b that expose GND layers 11a, 11b of an IC fabricated in the substrate 10, and also opening portions 22a, 22b that expose balanced signal (differential signal) input pads 12a, 12b of the IC. For the first resin layer 20, a photosensitive insulative resin with a relative permittivity Er is used. A fluid resin material of the photosensitive resin is coated on the substrate 10 by the spin coating method, to thereby form a photosensitive resin layer with a thickness of h1. In the photosensitive resin layer, the opening portions 21a, 21b, 22a, and 22b are formed by the photolithography method.

Note that the opening portions 21a, 21b are for bringing a ground end 30b of a balanced signal transmission line 30 and a ground end 35b of a balanced signal transmission line 35 into contact with the GND layers 11a, 11b, respectively. In addition, the opening portions 22a, 22b are for bringing a signal input/output end 30a of the balanced signal transmission line 30 and a signal input/output end 35a of the balanced signal transmission line 35 into contact with the balanced signal (differential signal) input pads 12a, 12b of the IC, respectively.

Next, as shown in FIG. 7 and FIG. 10, a first balanced signal transmission line 30 and a second balanced signal transmission line 35 are formed on the first resin layer 20. For the first balanced signal transmission line 30 and the second balanced signal transmission line 35, copper plating is used. After formation of a seed layer on the first resin layer 20, a resist is formed, which is then patterned by the photolithography method and is subjected to copper plating. The copper-plated layer is patterned by the etching method, to thereby form the first balanced signal transmission line 30 with a width of W, a thickness of T, and a length of L1, and the second balanced signal transmission line 35 with a width of W, a thickness of T, and a length of L2 (=L1). Furthermore, there are formed: an interconnection line 31a for electrically connecting between the signal input/output end 30a of the first balanced signal transmission line 30 and the balanced signal input pad 12a; an interconnection line 31b for electrically connecting between the ground end 30b of the first balanced signal transmission line 30 and the GND layer 11a; an interconnection line 36a for electrically connecting between the signal input/output end 35a of the second balanced signal transmission line 35 and the balanced signal input pad 12b; and an interconnection line 36b for electrically connecting between the ground end 35b of the second balanced signal transmission line 35 of the GND layer 11b.

Next, on the first resin layer 20 provided with the first balanced signal transmission line 30 and the second balanced signal transmission line 35, a second resin layer 40 is formed. For the second resin layer 40, a photosensitive insulative resin with a relative permittivity Er which is the same as that of the first resin layer 20 is used. A fluid resin material of the photosensitive resin is coated, by the spin coating method, on the first resin layer 20 provided with the first balanced signal transmission line 30 and the second balanced signal transmission line 35, to thereby form a photosensitive resin layer with a thickness of d from the top surface of balanced signal transmission line 30 and the top surface of the balanced signal transmission line 35.

Next, as shown in FIG. 8 and FIG. 11, an unbalanced signal transmission line 50 is formed on the second resin layer 40.

For the unbalanced signal transmission line 50, copper plating is used similarly to the first balanced signal transmission line 30 and the second balanced signal transmission line 35. After formation of a seed layer on the second resin layer 40, a resist is formed, which is then patterned by the photolithography method and is subjected to copper plating. The copper-plated layer is patterned by the etching method, to thereby form the unbalanced signal transmission line 50 with a width of W, a thickness of T, and a length of L, and an interconnection line 51 for electrically connecting a signal input/output end 50a of the unbalanced signal transmission line 50 to a package substrate and the like.

Next, on the second resin layer 40 provided with the unbalanced signal transmission line 50, a third resin layer 60 as a sealing resin layer is formed. In the third resin layer 60, an opening portion 61 to expose the interconnection line 51 is formed.

For the third resin layer 60, a photosensitive insulative resin with a relative permittivity Er which is the same as those of the first resin layer 20 and the second resin layer 40 is used. A fluid resin material of the photosensitive resin is coated, by the spin coating method, on the second resin layer 40 provided with the unbalanced signal transmission line 50, to thereby form a photosensitive resin layer with a thickness of h2 from the upper surface of the unbalanced signal transmission line 50. In the photosensitive resin layer, the opening portion 61 is formed by the photolithography method.

In the case of flip-chip-bonding the resin multilayer device 100, a solder bump for connecting the interconnection line 51 to a signal output pad of a substrate package or the like is formed in the opening portion 61.

After completion of the above procedure, the substrate 10, which is a silicon wafer, is diced to obtain WLP-type resin multilayer devices 100. It is preferable that the first balanced signal transmission line 30, the second balanced signal transmission line 35, and the unbalanced signal transmission line 50 be formed by bright-plating with copper. Other than by bright-plating with copper, they may also be formed by bright-plating with nickel (Ni), gold (Au), silver (Ag), or the like. Typically, at high signal frequencies, an electric current has a tendency to distribute itself within a conductor with the current density being largest near the surface of the conductor. This is called skin effect. For example, with a signal at a frequency of 10 GHz, copper has a skin depth of 0.66 μm. With a signal in a millimeter band at a frequency of 60 GHz, copper has a skin depth of 0.27 μm. As a result, the presence of unevenness on the surface of the transmission line causes an electric current to flow along a path longer than the case of a flat surface. Therefore, the presence of unevenness on the surface of the transmission line increases the transmission loss of the balun. Use of bright plating, which is capable of making the surface of the transmission line flat, makes it possible to reduce the transmission loss of the balun.

As described above, according to the first embodiment, there is provided a WLP having a balun in which a GND layer 16, a first resin layer 20, a first balanced signal transmission line 30 and a second balanced signal transmission line 35, a second resin layer 40, an unbalanced signal transmission line 50, and a third resin layer 60 (a sealing resin layer 60) are stacked on a substrate 10 in this order. With the WLCSP technology, it is possible to form resin layers and low-resistant transmission lines by copper plating or the like with high accuracy similar to that of the CMOS semiconductor process technology. Therefore, it is possible to obtain a balun with a highly accurate input/output impedance and a low insertion loss. In addition, if an IC is formed in the substrate, it is possible to make the balun monolithic.

Furthermore, with the formation of a balun in a multilayer resin, it is possible to reduce the number of layers more than the case of manufacturing a balun by the LTCC technology, leading to easier manufacturing. In the resin multilayer device 100 of the first embodiment, the GND layer for grounding the ground end 30b of the first balanced signal transmission line 30 and the ground end 35b of the second balanced signal transmission line 35 is connected to a GND layer of the IC fabricated in the substrate 10 or to a GND layer of the printed wiring board.

Furthermore, with the formation of the balun by use of a multilayer resin and transmission lines by copper plating, it is possible to make the balun lighter, increase its resistance to impact, and improve its ability to release heat.

Furthermore, in the case of using Si for the substrate, the balun can be made thinner by grinding the Si from its back surface. This allows the balun to be used as it is built in a substrate.

Modification 1 of First Embodiment

Figure 12:
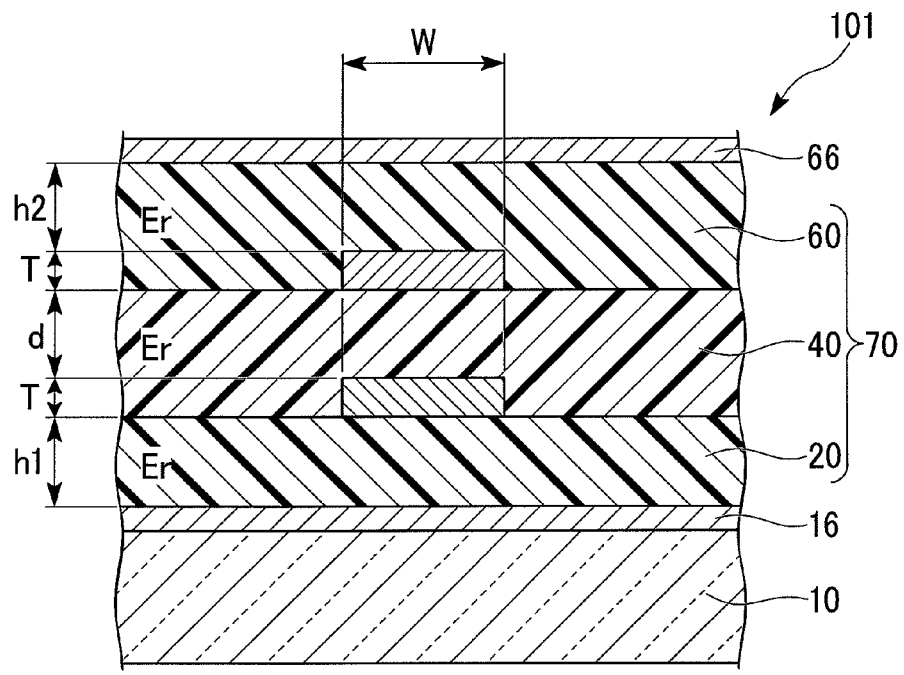
FIG. 12 is a cross-sectional view for explaining a modification 1 of the resin multilayer device of the first embodiment, when seen in a width direction of transmission lines.
Figure 13:
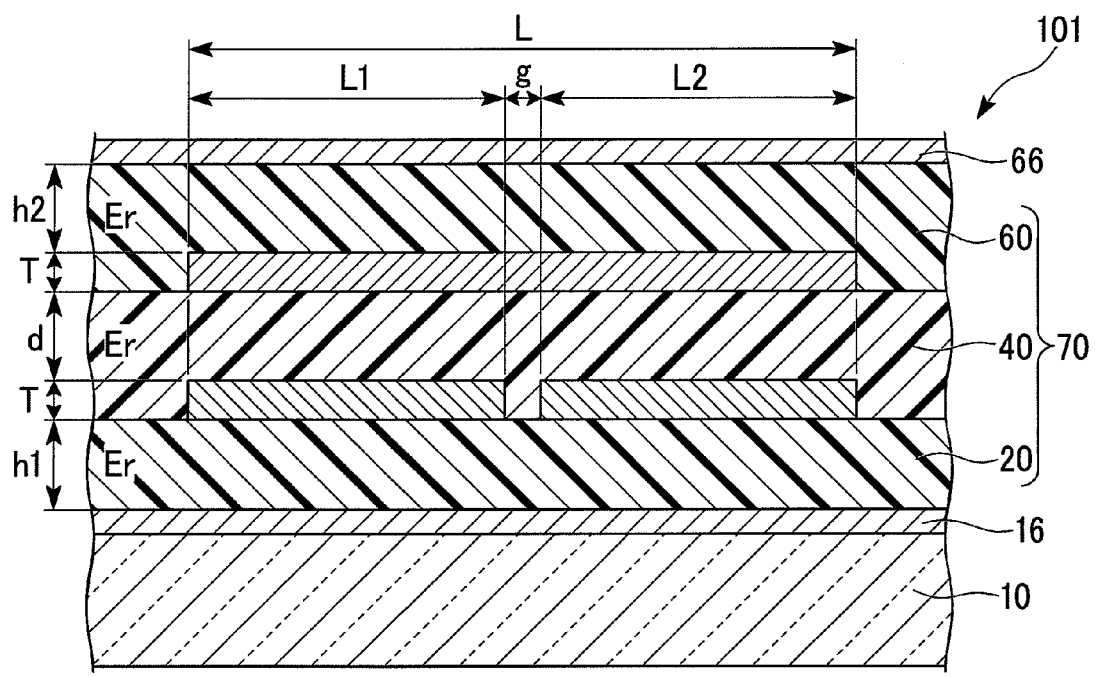
FIG. 13 is a cross-sectional view for explaining the modification 1 of the resin multilayer device of the first embodiment, when seen in a length direction of the transmission lines.

FIG. 12 is a cross-sectional view for explaining a resin multilayer device 101 of a modification 1 of the first embodiment, when seen in a width direction of transmission lines. FIG. 13 is a cross-sectional view for explaining the resin multilayer device 101 of the modification 1 of the first embodiment, when seen in a length direction of the transmission lines.

In FIG. 12 and FIG. 13, components the same as those of FIG. 1 to FIG. 11 are designated with the same reference symbols. The resin multilayer device 101 according to the modification 1 of the first embodiment is a WLP, including: a substrate 10; a first GND layer 16; a first resin layer 20; a first balanced signal transmission line 30 and a second balanced signal transmission line 35; a second resin layer 40; an unbalanced signal transmission line 50; a third resin layer 60; and a second GND layer 66.

The resin multilayer device 101 of FIG. 12 and FIG. 13 is one in which a second GND layer 66 is formed on the third resin layer 60 in the resin multilayer device 100 of the first embodiment (see FIG. 1 to FIG. 4).

The first GND layer 16 is formed of, for example, copper plating, an aluminum film, or a copper film. The second GND layer 66 is formed of, for example, copper plating, an aluminum film, or a copper film. In the case where the first GND layer 16 and the second GND layer 66 are allowed to be conducted to only either one of the GND of the substrate 10 and the GND of the substrate in which the resin multilayer device 101 is packaged, it is required that a conductive via hole be provided through the multilayer resin body 70 in order to connect between the first GND layer 16 and the second GND layer 66. This makes it possible to maintain the first GND layer 16 and the second GND layer 66 at the same potential. In the case of flip-chip-packaging the resin multilayer device, the first balanced signal transmission line 30, the second balanced signal transmission line 35, and the unbalanced signal transmission line 50 are surrounded from top and bottom by the first GND layer 16 and the second GND layer 66 in this manner. As a result, the characteristics of the balun are dependent on the electromagnetic field in the area surrounded by the first GND layer 16 and the second GND layer 66. Therefore, it is possible to reduce the influence from the substrate package and the influence from the circuit formed in the substrate 10, thus preventing the balun from being influenced by the external environmental change.

Modification 2 of First Embodiment

Figure 14:
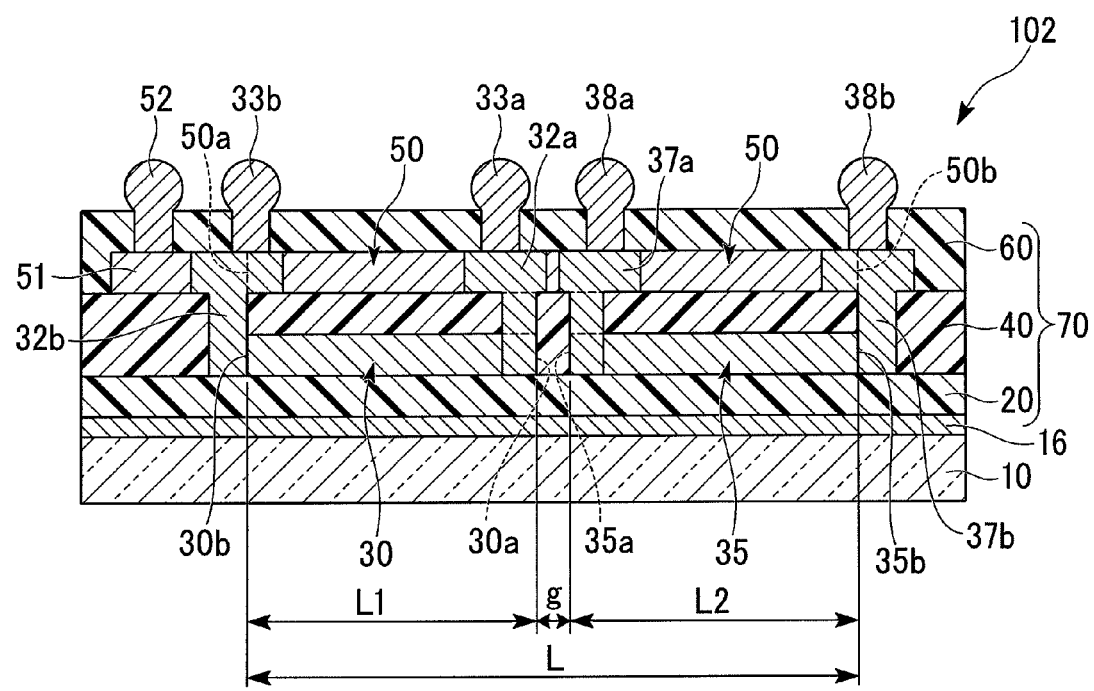
FIG. 14 is a cross-sectional view for explaining a modification 2 of the resin multilayer device of the first embodiment, when seen in a length direction of transmission lines.

FIG. 14 is a cross-sectional view for explaining a resin multilayer device 102 of a modification 2 of the first embodiment, when seen in a length direction of transmission lines. In FIG. 14, components the same as those of FIG. 1 to FIG. 11 are designated with the same reference symbols. The resin multilayer device 102 according to the modification 2 of the first embodiment is a WLP, including: a substrate 10; a GND layer 16; a first resin layer 20; a first balanced signal transmission line 30 and a second balanced signal transmission line 35; a second resin layer 40; an unbalanced signal transmission line 50; a third resin layer 60; and solder bumps 33a, 33b, 38a, 38b, and 52.

The resin multilayer device 102 of FIG. 14 is one in which solder bumps 33a, 33b, 38a, 38b, and 52 for flip-chip packaging or for other purposes are provided in opening portions formed in the third resin layer 60 in the resin multilayer device 100 according to the first embodiment (FIG. 1 to FIG. 4).

The solder bump 33a is an input/output terminal for the balanced signal SD1 (see FIG. 1 or FIG. 5), and is connected to a signal input/output end 30a of the first balanced signal transmission line 30 via an interconnection line 32a. Similarly, the solder bump 38a is an input/output terminal for a balanced signal SD2 (see FIG. 1), and is connected to a signal input/output end 35a of the second balanced signal transmission line 35 via an interconnection line 37a. The solder bump 52 is connected to the signal input/output end 50a of the unbalanced signal transmission line 50 via the interconnection line 51.

The solder bump 33b is a ground terminal, and is connected to the ground end 30b of the first balanced signal transmission line 30 via the interconnection line 32b. Similarly, the solder bump 38b is a ground terminal, and is connected to the ground end 35b of the second balanced signal transmission line 35 via the interconnection line 37b.

Second Embodiment

Figure 15:
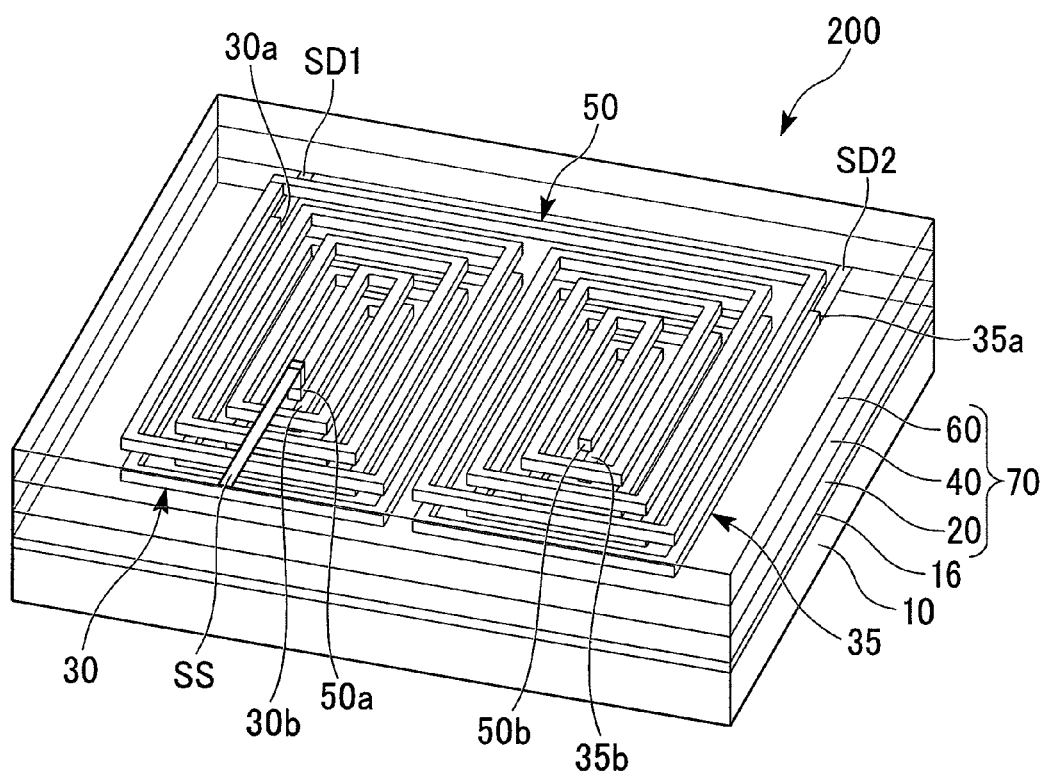
FIG. 15 is a perspective view schematically showing an exemplary structure of a resin multilayer device according to a second embodiment of the present invention.

FIG. 15 is a perspective view schematically showing an exemplary structure of a resin multilayer device 200 according to a second embodiment of the present invention. In FIG. 15, components the same as those of FIG. 1 are designated with the same reference symbols. The resin multilayer device 200 according to the second embodiment is a WLP, including: a substrate 10; a first resin layer 20; a first balanced signal transmission line 30 and a second balanced signal transmission line 35 that are formed in a planar spiral shape; a second resin layer 40; an unbalanced signal transmission line 50 formed in a planar spiral shape; and a third resin layer 60.

Namely, the resin multilayer device 200 according to the second embodiment shown in FIG. 15 is one in which the first balanced signal transmission line 30 and the second balanced signal transmission line 35, which are formed straight in the first embodiment (see FIG. 1), are made as a first balanced signal transmission line 30 and a second balanced signal transmission line 35 both with a spiral shape, and also in which the unbalanced signal transmission line 50, which is formed straight in the first embodiment (see FIG. 1), is accordingly made as a spiral-shaped unbalanced signal transmission line 50. Therefore, the spiral-shaped first balanced signal transmission line 30 and second balanced signal transmission line 35 are electromagnetically coupled to the spiral-shaped unbalanced signal transmission line 50 arranged opposed to the spiral-shaped first balanced signal transmission line 30 and second balanced signal transmission line 35, to thereby form a stack-type balun. Similarly to the first embodiment, the balun of the second embodiment is formed in a stack as transmission lines of copper plating or the like in a multilayer resin body 70 on a GND layer 16 on the substrate 10.

If the first balanced signal transmission line 30, the second balanced signal transmission line 35, and the unbalanced signal transmission line 50 are shaped straight as is the case with the first embodiment, space is not required in the width direction of the transmission lines. But, in the length direction of the transmission lines, space with a transmission line length of the unbalanced signal transmission line 50 or longer is required. However, in applications to a some-GHz band, it is often difficult in actuality to find such long space on the resin multilayer device.

Therefore, in the second embodiment, the first balanced signal transmission line 30, the second balanced signal transmission line 35, and the unbalanced signal transmission line 50 are formed in a spiral shape. This allows the first balanced signal transmission line 30, the second balanced signal transmission line 35, and the unbalanced signal transmission line 50 with a long transmission line length to be arranged in a narrow space with a shape such as a square or an ellipse. Therefore, with the spiral-shaped configuration, it is possible to provide a balun with a reduced occupation space and with long transmission lines.

A planar spiral by the first balanced signal transmission line 30 formed on the first resin layer 20 is referred to as a first spiral. Similarly, a planar spiral by the second balanced signal transmission line 35 formed on the first resin layer 20 is referred to as a second spiral. The unbalanced signal transmission line 50 disposed on the second resin layer 40 is formed as a single transmission line that draws two spirals along the first and second spirals.

In the first spiral, an outer circumferential end of the first balanced signal transmission line 30 is a signal input/output end 30*a* for a balanced signal SD1, and an inner circumferential end of the first balanced signal transmission line 30 is a ground end 30*b*.

The first spiral is a spiral curving clockwise from its inner circumferential end to its outer circumferential end when seen from the top side of the resin multilayer device 200.

Similarly, in the second spiral, an outer circumferential end of the second balanced signal transmission line 35 is a signal input/output end 35*a* for a balanced signal SD2, and an inner circumferential end of the second balanced signal transmission line 35 for a ground end 35*b*. The second spiral is a spiral curving counterclockwise from its inner circumferential end to its outer circumferential end when seen from the top side of the resin multilayer device 200. However, when seen from the top side of the resin multilayer device 200, the first spiral may form a spiral curving counterclockwise from its inner circumferential end to its outer circumferential end, and the second spiral may form a spiral curving clockwise from its inner circumferential end to its outer circumferential end.

The spiral-shaped unbalanced signal transmission line 50 is formed clockwise from an inner circumferential end to an outer circumferential end along the part corresponding to the first spiral so as to be opposed to the first balanced signal transmission line 30, and is formed counterclockwise from an inner circumferential end to an outer circumferential end along the part corresponding to the second spiral so as to be opposed to the second balanced signal transmission line 35. The outer circumferential end of the first spiral and the outer circumferential end of the second spiral are coupled to form a single transmission line. The inner circumferential end on the first spiral side of the unbalanced signal transmission line 50 is a signal input/output end 50*a* for an unbalanced signal SS. The inner circumferential end on the second spiral side of the unbalanced signal transmission line 50 is an open end 50*b*. Note that, when seen from the top side of the resin multilayer device 200, the unbalanced signal transmission line 50 may form, in the first spiral, a counterclockwise spiral curving from the inner circumferential end to the outer circumferential end so as to be opposed to the balanced signal transmission line 30 and may form, in the second spiral, a clockwise spiral curving from the inner circumferential end to the outer circumferential end so as to be opposed to the balanced signal transmission line 35.

As described above, according to the second embodiment, the advantage similar to that of the first embodiment is obtained. In addition, with the transmission lines that form the balun being provided as a spiral shape, it is possible to reduce the space occupied by the balun while making the transmission lines longer.

Note that the manufacturing procedure of the resin multilayer device 200 of the second embodiment is similar to that of the first embodiment.

Third Embodiment

Figure 16:
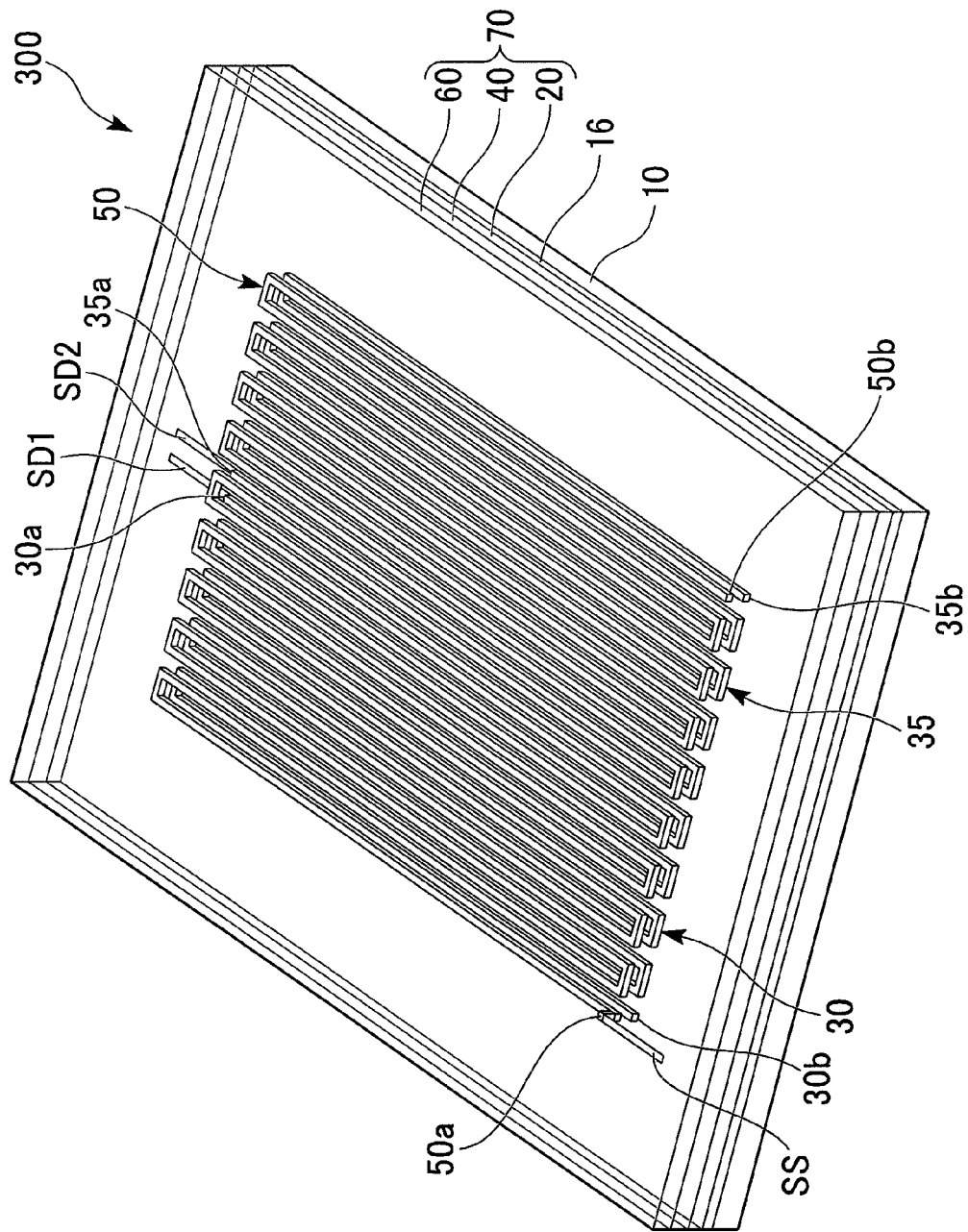
FIG. 16 is a perspective view schematically showing an exemplary structure of a resin multilayer device according to a third embodiment of the present invention.

FIG. 16 is a perspective view schematically showing an exemplary structure of a resin multilayer device 300 according to a third embodiment of the present invention. In FIG. 16, components the same as those of FIG. 1 are designated with the same reference symbols. The resin multilayer device 300 according to the third embodiment is a WLP, including: a substrate 10; a GND layer 16; a first resin layer 20; a first balanced signal transmission line 30 and a second balanced signal transmission line 35 that are formed in a meander shape; a second resin layer 40; an unbalanced signal transmission line 50; and a third resin layer 60.

Namely, the resin multilayer device 300 according to the third embodiment of FIG. 16 is one in which the first balanced signal transmission line 30 and the second balanced signal transmission line 35, which are formed straight in the first embodiment (see FIG. 1), are respectively made as a first balanced signal transmission line 30 and a second balanced signal transmission line 35 that have a meander shape, and also the unbalanced signal transmission line 50, which is formed straight in the first embodiment (FIG. 1) is accordingly made as a unbalanced signal transmission line 50 with a meander shape. Therefore, the meander-shaped first balanced signal transmission line 30 and the meander-shaped second balanced signal transmission line 35 are electromagnetically coupled to the meander-shaped unbalanced signal transmission line 50 arranged facing the meander-shaped first balanced signal transmission line 30 and the meander-shaped second balanced signal transmission line 35, to thereby form a stack-type balun. Similarly to the first embodiment, the balun of the third embodiment is formed in a stack as transmission lines of copper plating or the like in a multilayer resin body 70 on a GND layer 16 on the substrate 10.

If the first balanced signal transmission line 30, the second balanced signal transmission line 35, and the unbalanced signal transmission line 50 are shaped straight as is the case with the first embodiment, space is not required in the width direction of the transmission lines. However, in the length direction of the transmission lines, space with a transmission line length of the unbalanced signal transmission line 50 or longer is required. However, in applications to a some-GHz band, it is often difficult in actuality to find such a long space on the resin multilayer device.

Therefore, in the third embodiment, the first balanced signal transmission line 30, the second balanced signal transmission line 35, and the unbalanced signal transmission line 50 are formed in a meander shape. This allows the first balanced signal transmission line 30, the second balanced signal transmission line 35, and the unbalanced signal transmission line 50 with a long transmission line length to be arranged in narrow space with a shape such as a square. Therefore, with the meander-shaped configuration, it is possible to provide a balun with reduced occupation space and with long transmission lines.

The meander formed by the first balanced signal transmission line 30 formed on the first resin layer 20 is referred to as a first meander. Similarly, the meander that is formed by the second balanced signal transmission line 35 formed on the first resin layer 20 and is arranged adjacent to the first meander, is referred to as a second meander. The unbalanced signal transmission line 50 formed on the second resin layer 40 is formed as a single transmission line as if by drawing a single meander along the first and second meanders.

In the first meander, an end of the transmission line of the first balanced signal transmission line 30 that is positioned at the corner on the side adjacent to the second meander is a signal input/output end 30a for a balanced signal SD1, and an end of the transmission line of the first balanced signal transmission line 30 that is positioned at the corner on the side not adjacent to the second meander is a ground end 30b.

Similarly, in the second meander, an end of the transmission line of the second balanced signal transmission line 35 that is positioned at the corner on the side adjacent to the first meander is a signal input/output end 35a for a balanced signal SD2, and an end of the transmission line of the second balanced signal transmission line 35 that is positioned at the corner on the side not adjacent to the first meander is a ground end 35b.

The meander-shaped unbalanced signal transmission line 50 is formed as a single meander-shaped transmission line, along the area on the second resin layer 40 that is opposed to the areas of the first meander and the second meander on the first resin layer 20, so as to be opposed to the first balanced signal transmission line 30 and the second balanced signal transmission line 35. The end of the transmission line of the unbalanced signal transmission line 50 positioned above the area of the first meander is a signal input/output end 50a for an unbalanced signal SS, and the end of the transmission line of the unbalanced signal transmission line 50 positioned above the area of the second meander is an open end 50b.

As described above, according to the third embodiment, the advantage similar to that of the first embodiment is obtained. In addition, with the transmission lines that form the balun being provided in meander shapes, it is possible to reduce the space occupied by the balun while making the transmission lines longer.

Note that the manufacturing procedure of the resin multilayer device 300 of the third embodiment is similar to that of the first embodiment.

Fourth Embodiment

Figure 17:
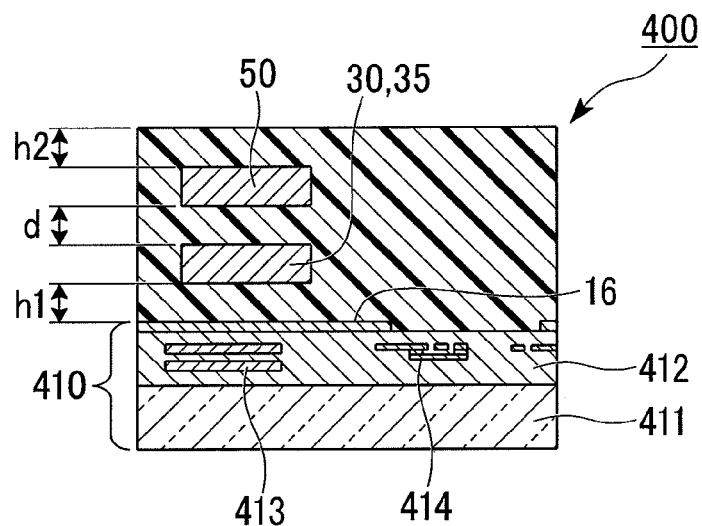
FIG. 17 is a cross-sectional view for explaining a resin multilayer device according to a fourth embodiment of the present invention, when seen in a width direction of transmission lines.

FIG. 17 is a cross-sectional view for explaining an exemplary structure of a resin multilayer device 400 according to a fourth embodiment of the present invention, when seen in a width direction of transmission lines. The fourth embodiment is a case where the substrate is a CMOS-IC substrate 410.

The resin multilayer device 400 according to the fourth embodiment is a WLP, including: a CMOS-IC substrate 410; a GND layer 16; a first resin layer 20; a first balanced signal transmission line 30 and a second balanced signal transmission line 35; a second resin layer 40; a single, unbalanced signal transmission line 50; and a third resin layer 60.

The CMOS-IC substrate 410 includes a substrate 411 and a $SiO_2$ layer 412. In the $SiO_2$ layer 412, an Al or AlCu interconnection line 413 and an inductor 414 are arranged. On the $SiO_2$ layer 412, a GND layer 16 is formed. However, above the inductor 414, a window is formed in the GND layer 16. The structure from the GND layer 16 and above is the same as that of the first embodiment.

As described above, according to the fourth embodiment, the advantage similar to that of the first embodiment is obtained. In addition, with the absence of the GND layer 16 above the inductor 414, it is possible to prevent deterioration of the characteristics of the inductor provided in the IC.

Fifth Embodiment

Figure 18:
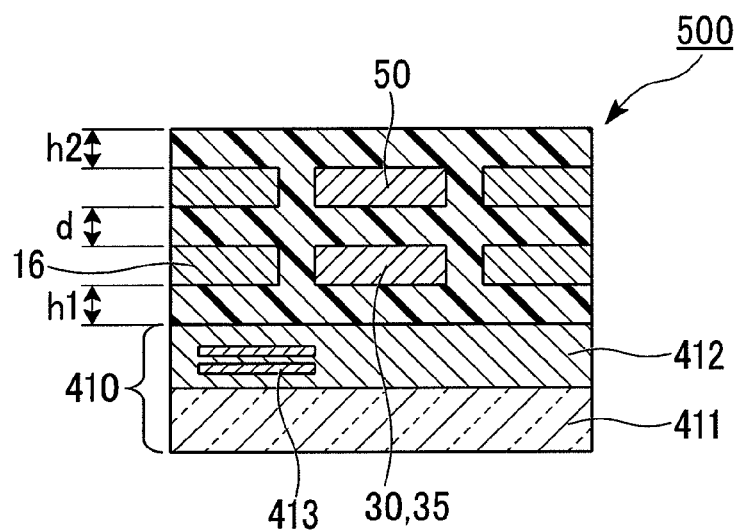
FIG. 18 is a cross-sectional view for explaining a resin multilayer device according to a fifth embodiment of the present invention, when seen in a width direction of transmission lines.

FIG. 18 is a cross-sectional view for explaining an exemplary structure of a resin multilayer device 500 according to a fifth embodiment of the present invention, when seen in a width direction of transmission lines. The fifth embodiment is a case where the substrate is a CMOS-IC substrate 410.

The resin multilayer device 500 according to the fifth embodiment is a WLP, including: a CMOS-IC substrate 410; a GND layer 16; a first resin layer 20; a first balanced signal transmission line 30 and a second balanced signal transmission line 35; a second resin layer 40; a single, unbalanced signal transmission line 50; and a third resin layer 60.

The CMOS-IC substrate 410 includes a substrate 411 and a $SiO_2$ layer 412. In the $SiO_2$ layer 412, an Al or AlCu interconnection line 413 is arranged. The difference form the fourth embodiment lies in that the GND layer 16 is formed not on the $SiO_2$ layer 412, but around the transmission lines.

As described above, according to the fifth embodiment, the advantages similar to those of the first embodiment and the fourth embodiment are obtained. In addition, an influence of the GND layer 16 on the operation of the CMOS-IC substrate 410 is prevented because the CMOS-IC substrate 410 and the GND layer 16 are spaced. This makes a monolithic balun with stable characteristics feasible.

Sixth Embodiment

FIG. 19 to FIG. 26 are cross-sectional views for explaining a manufacturing procedure of a resin multilayer device 600 according to a sixth embodiment of the present invention, when seen in a width direction of transmission lines.

Figure 19:
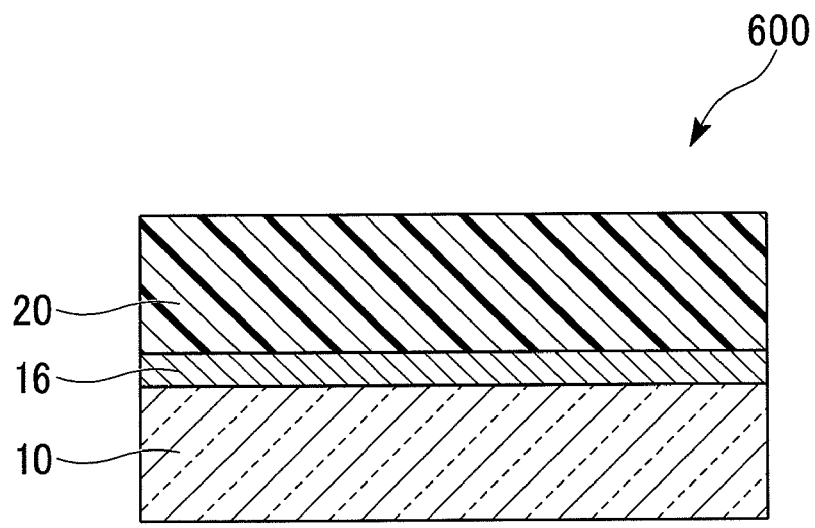
FIG. 19 is a cross-sectional view showing a manufacturing procedure of a resin multilayer device according to a sixth embodiment of the present invention, when seen in a width direction of transmission lines.

As shown in FIG. 19, a photosensitive resin is spread on a GND layer 16 on a substrate 10 to form a first resin layer 20.

Figure 20:
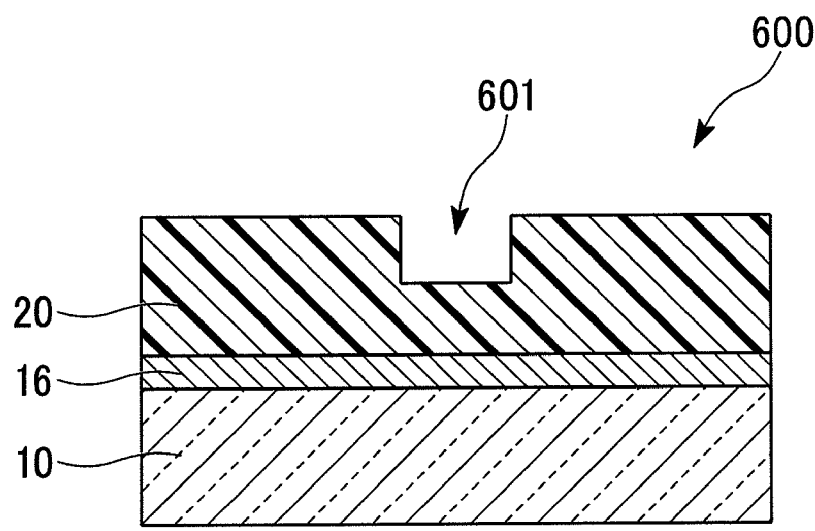
FIG. 20 is a cross-sectional view showing the manufacturing procedure of the resin multilayer device according to the sixth embodiment of the present invention, when seen in the width direction of the transmission lines.

Next, as shown in FIG. 20, a recess portion 601 is formed in the upper portion of the first resin layer 20 by the photolithography method.

Figure 21:
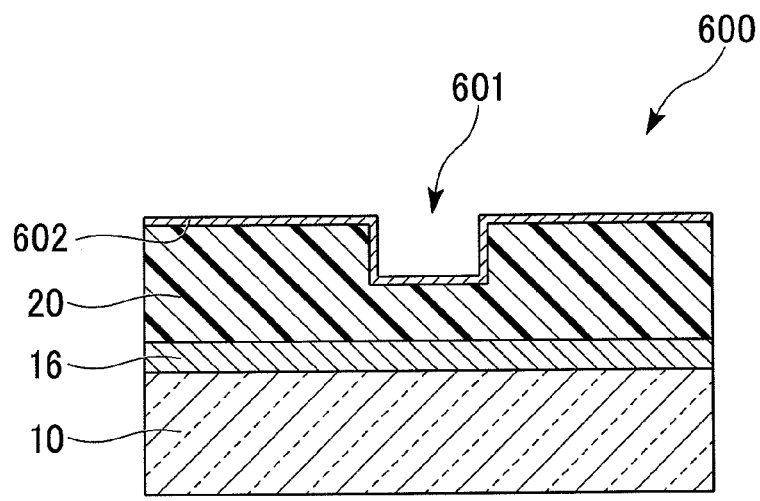
FIG. 21 is a cross-sectional view showing the manufacturing procedure of the resin multilayer device according to the sixth embodiment of the present invention, when seen in the width direction of the transmission lines.

Next, as shown in FIG. 21, a seed layer 602 is formed on the first resin layer 20 by sputtering. By sputtering, a first layer made of TiW or Cr is formed, and then a second layer made of Cu is formed thereon. The seed layer 602 is typically a stack formed of a first layer made of TiW or Cr and a second layer made of Cu. However, other materials may be used.

Figure 22:
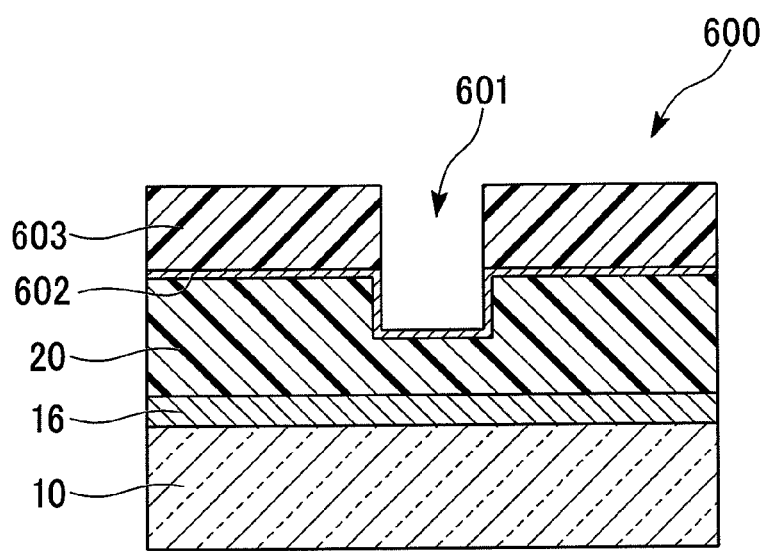
FIG. 22 is a cross-sectional view showing the manufacturing procedure of the resin multilayer device according to the sixth embodiment of the present invention, when seen in the width direction of the transmission lines.

Next, as shown in FIG. 22, a resist 603 is formed, by patterning, on the seed layer 602 outside the recess portion 601.

Figure 23:
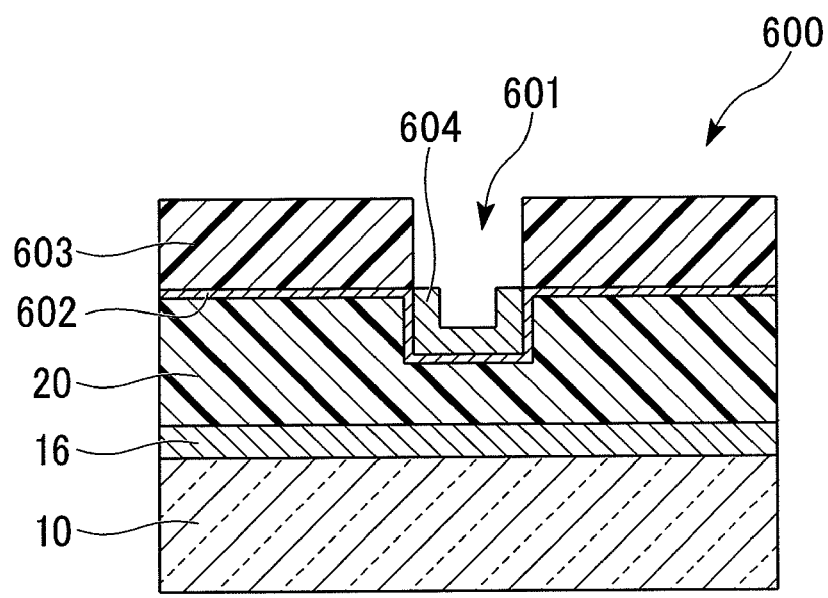
FIG. 23 is a cross-sectional view showing the manufacturing procedure of the resin multilayer device according to the sixth embodiment of the present invention, when seen in the width direction of the transmission lines.

Next as shown in FIG. 23, a lower interconnection line 604 is formed in the recess portion 601 by a plating treatment. The lower interconnection line 604 corresponds to the first balanced signal transmission line 30 or the second balanced signal transmission line 35.

Figure 24:
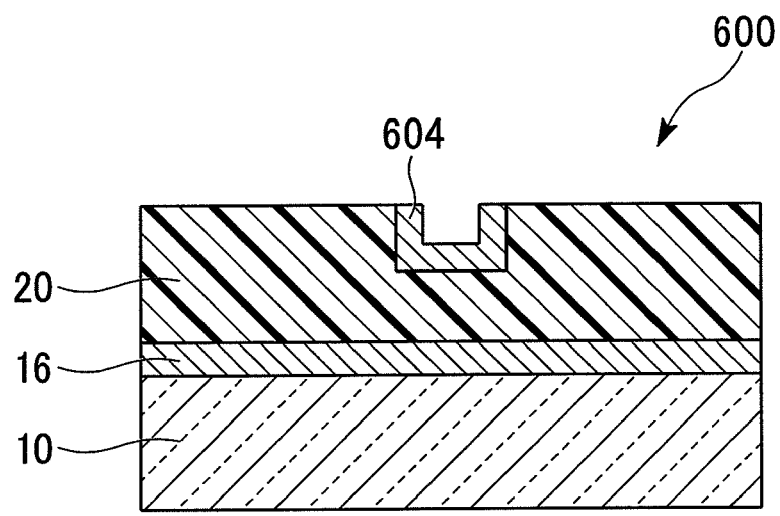
FIG. 24 is a cross-sectional view showing the manufacturing procedure of the resin multilayer device according to the sixth embodiment of the present invention, when seen in the width direction of the transmission lines.

Next, as shown in FIG. 24, after removal of the resist 603, the seed layer 602 is removed by etching.

Figure 25:
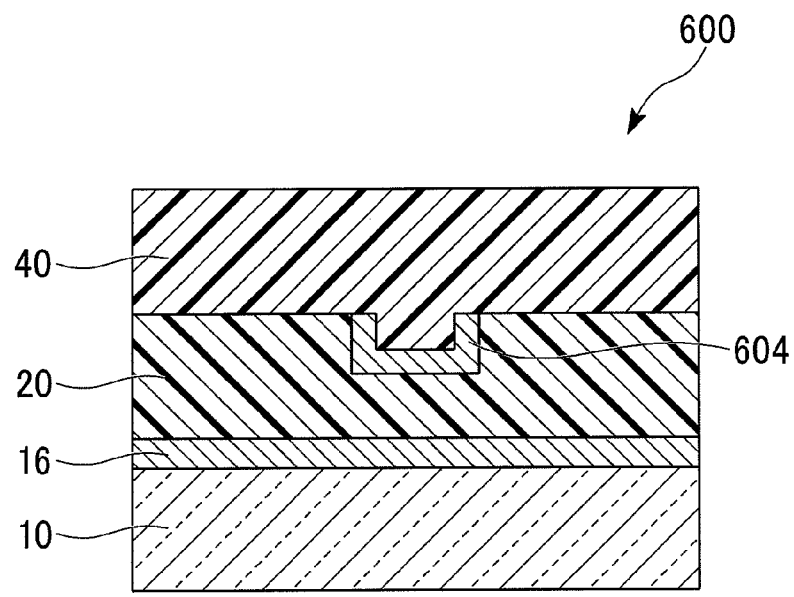
FIG. 25 is a cross-sectional view showing the manufacturing procedure of the resin multilayer device according to the sixth embodiment of the present invention, when seen in the width direction of the transmission lines.

Next, as shown in FIG. 25, a second resin layer 40 is formed on the first resin layer 20. Because the lower interconnection line 604 is formed in the recess portion 601 of the first resin layer 20, the upper portion of the first resin layer 20 becomes flat. Therefore, it is possible to form the second resin layer 40 flat.

Figure 26:
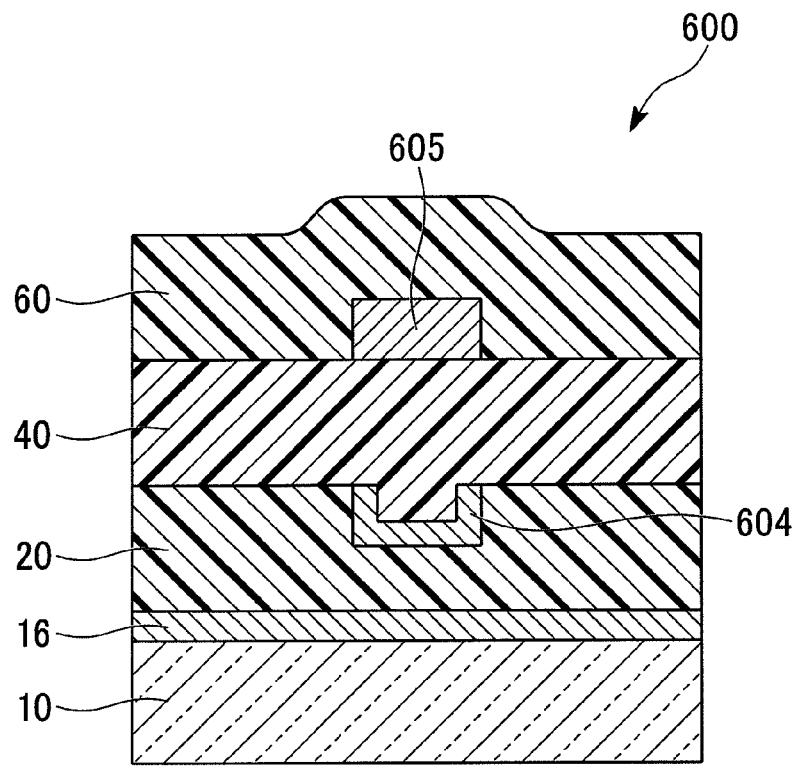
FIG. 26 is a cross-sectional view showing the manufacturing procedure of the resin multilayer device according to the sixth embodiment of the present invention, when seen in the width direction of the transmission lines.

Next, as shown in FIG. 26, an upper interconnection line 605 is formed on the second resin layer 40. The upper interconnection line 605 corresponds to the unbalanced signal transmission line 50. The formation method of the upper interconnection line 605 may be similar to that of the unbalanced signal transmission line 50 in the first embodiment. After formation of the upper interconnection line 605, a third resin layer 60 is formed on the second resin layer 40. The formation method of the third resin layer 60 may be similar to that of the third resin layer 60 in the first embodiment.

As described above, according to the sixth embodiment, the advantage similar to that of the first embodiment is obtained. In addition, with the second resin layer 40 being formed flat, it is possible to offer highly accurate impedance control. Furthermore, with the lower interconnection line 604 being formed in the recess portion 601 into a recessed shape, the surface area of the lower interconnection line 604 becomes larger. This makes it possible to reduce the resistance of the lower interconnection line 604.

Seventh Embodiment

FIG. 27 to FIG. 31 are cross-sectional views showing a manufacturing procedure of a resin multilayer device 700 according to a seventh embodiment of the present invention, when seen in a width direction of transmission lines.

Figure 27:
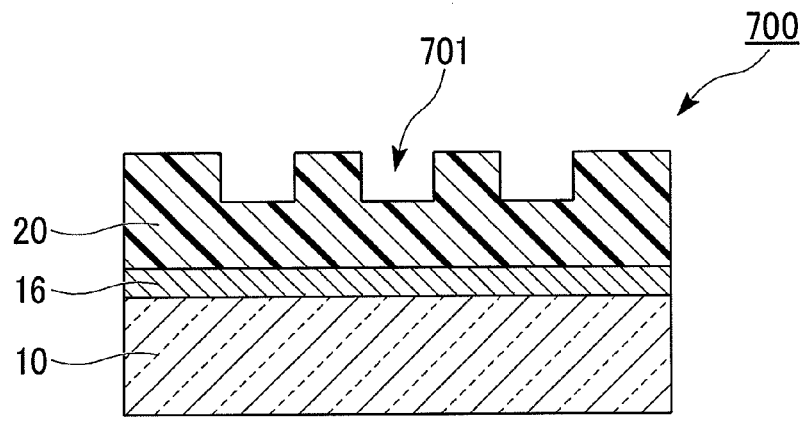
FIG. 27 is a cross-sectional view showing a manufacturing procedure of a resin multilayer device according to a seventh embodiment of the present invention, when seen in a width direction of transmission lines.

Similarly to FIG. 19 of the sixth embodiment, a photosensitive resin is spread on a GND layer 16 on a substrate 10 to form a first resin layer 20. After that, as shown in FIG. 27, a plurality of recess portions 701 are formed in the upper portion of the first resin layer 20 by the photolithography method.

Figure 28:
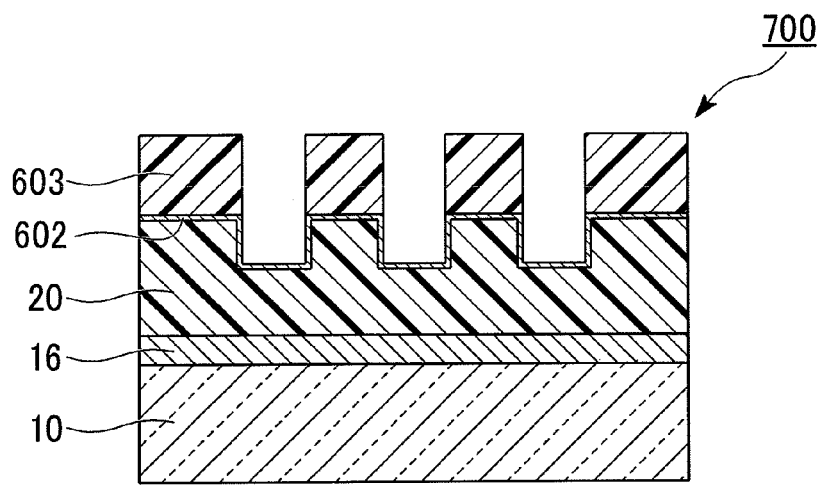
FIG. 28 is a cross-sectional view showing the manufacturing procedure of the resin multilayer device according to the seventh embodiment of the present invention, when seen in the width direction of the transmission lines.

Next, similarly to FIG. 21 of the sixth embodiment, a seed layer 602 is formed on the first resin layer 20 by sputtering. After that, as shown in FIG. 28, a resist 603 is formed by patterning.

Figure 29:
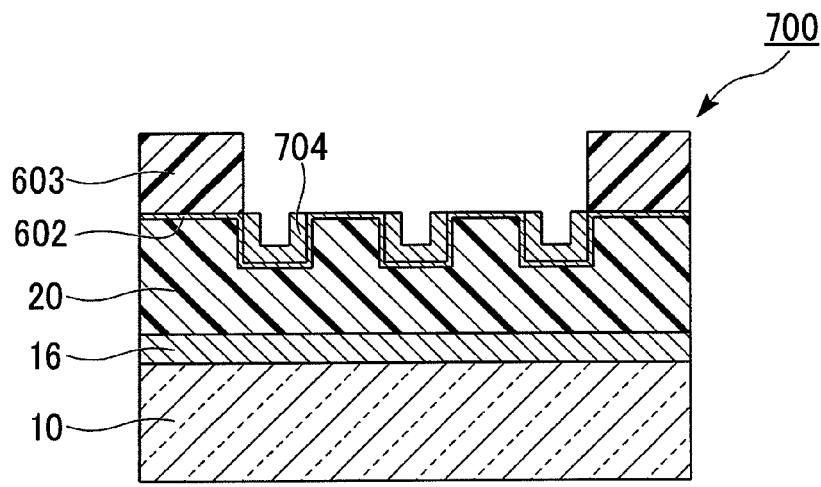
FIG. 29 is a cross-sectional view showing the manufacturing procedure of the resin multilayer device according to the seventh embodiment of the present invention, when seen in the width direction of the transmission lines.

Next, as shown in FIG. 29, plating treatment is performed to form a plurality of lower interconnection lines 704 in the plurality of recess portions 701.

Figure 30:
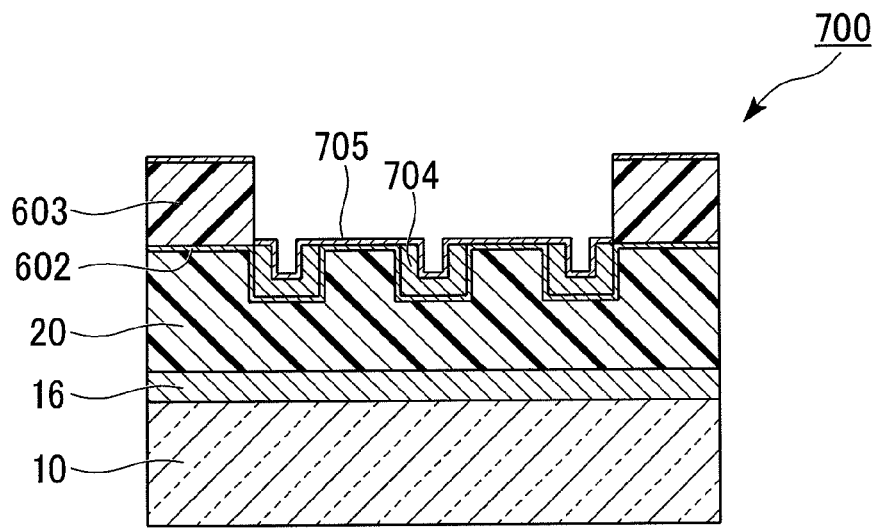
FIG. 30 is a cross-sectional view showing the manufacturing procedure of the resin multilayer device according to the seventh embodiment of the present invention, when seen in the width direction of the transmission lines.

Next as shown in FIG. 30, a metal layer 705 is formed by sputtering to electrically connect the plurality of lower interconnection lines 704.

Figure 31:
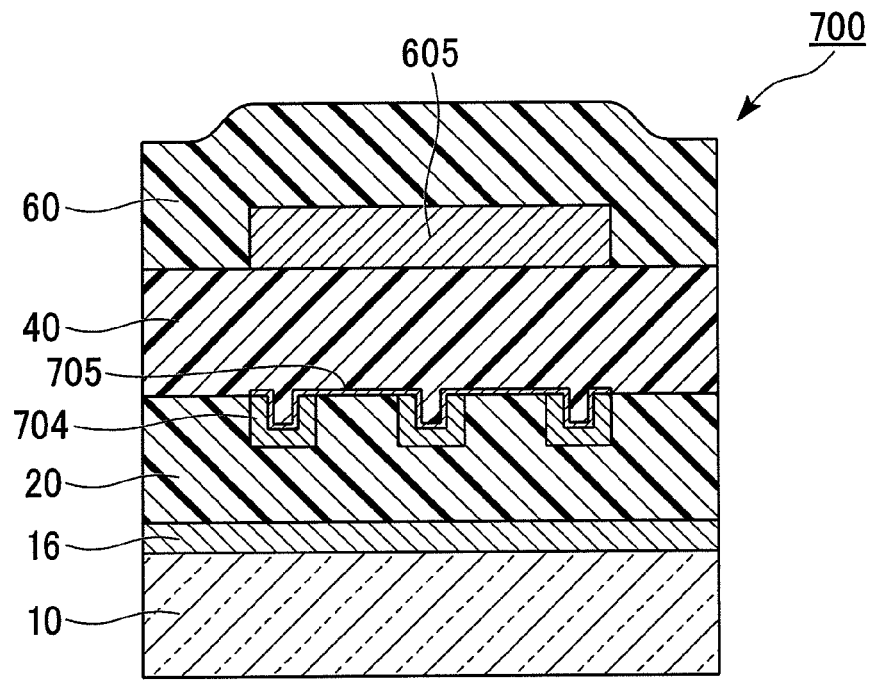
FIG. 31 is a cross-sectional view showing the manufacturing procedure of the resin multilayer device according to the seventh embodiment of the present invention, when seen in the width direction of the transmission lines.

Next, as shown in FIG. 31, after removal of the resist 603, the seed layer 602 is removed by etching. After that, similarly to the sixth embodiment, a second resin layer 40 is formed on the first resin layer 20, and an upper interconnection line 605 is formed on the second resin layer 40. After formation of the upper interconnection line 605, a third resin layer 60 is formed on the second resin layer 40.

As described above, according to the seventh embodiment, the advantages similar to those of the first embodiment and the sixth embodiment are obtained. In addition, provision of a plurality of recess portions makes it possible to make the aspect ratio of the lower interconnection lines 704 small, and to make short the bumps of the second resin layer 40 on the lower interconnection lines 704 formed in the recess portions. With the second resin layer 40 being formed flatter, it is possible to realize impedance control with higher accuracy.

Modification 1 of Seventh Embodiment

Figure 32:
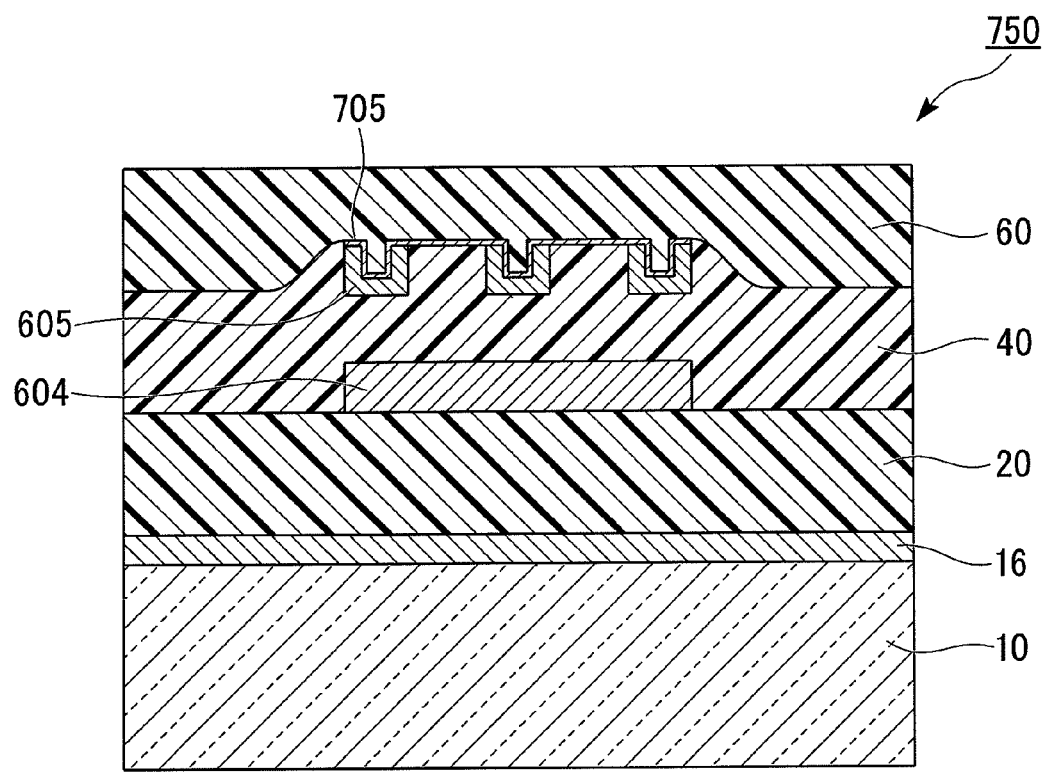
FIG. 32 is a cross-sectional view showing a modification of the seventh embodiment of the manufacturing procedure of the present invention, when seen in a width direction of transmission lines.

FIG. 32 is a cross-sectional view showing a manufacturing procedure of a resin multilayer device 750 according to a modification 1 of the seventh embodiment of the present invention, when seen in a width direction of transmission lines. The difference from the sixth embodiment lies in that not the lower interconnection line 604 but the upper interconnection line 605 is formed in a recess shape. The manufacturing procedure of the recess-shaped upper interconnection line 605 is similar to that of the lower interconnection line 704 of the seventh embodiment.

Modification 2 of Seventh Embodiment

Figure 33:
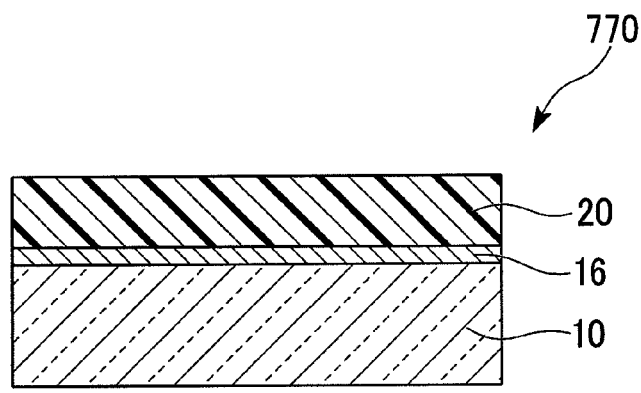
FIG. 33 is a cross-sectional view showing a modification 2 of the seventh embodiment of the manufacturing procedure of the present invention, when seen in a width direction of transmission lines.
Figure 34:
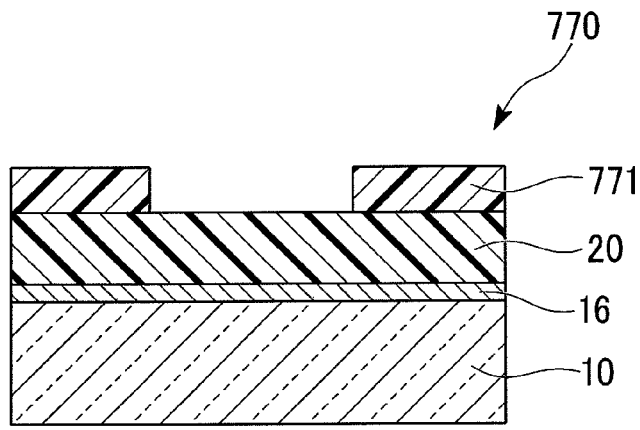
FIG. 34 is a cross-sectional view showing the manufacturing procedure of the modification 2 of the seventh embodiment of the resin multilayer device of the present invention, when seen in the width direction of the transmission lines.

As a fabrication method of a recess portion in the sixth embodiment and the seventh embodiment may be as follows. FIG. 33 and FIG. 34 are cross-sectional views showing a manufacturing procedure of a resin multilayer device 770 according to a modification 2 of the seventh embodiment, when seen in a width direction of transmission lines.

As shown in FIG. 33, a resin is spread on a GND layer 16 on a substrate 10 to form a first resin layer 20. Unlike the case of the sixth embodiment and the seventh embodiment, the resin may not be photosensitive.

Next, as shown in FIG. 34, a new photosensitive resin layer 771 is formed on the first resin layer 20 and a recess portion is formed.

As described above, according to the modification 2 of the seventh embodiment, the advantage similar to that of the sixth embodiment and the seventh embodiment is obtained. In addition, no recess portion is required to be formed in the first resin layer 20. As a result, a height h1 of the first resin layer 20 can be made large, allowing the interconnection line to be made thicker.

Eighth Embodiment

Figure 35:
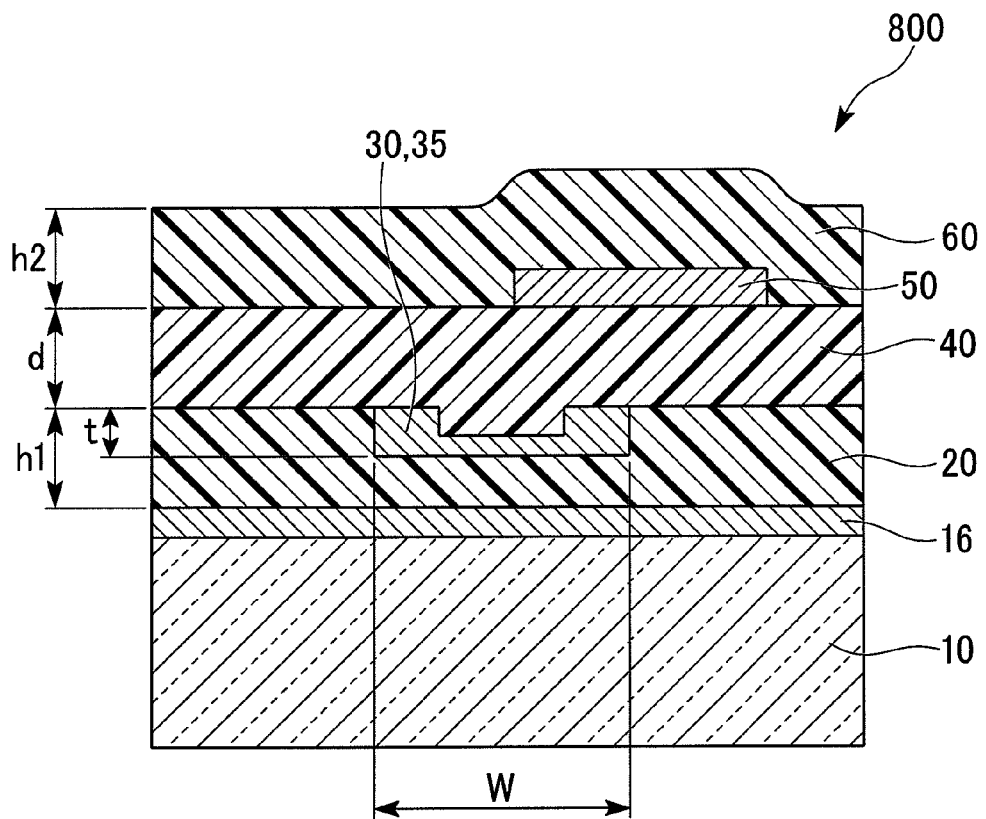
FIG. 35 is a cross-sectional view for explaining an exemplary structure of a resin multilayer device according to an eighth embodiment of the present invention, when seen in a width direction of transmission lines.

FIG. 35 is a cross-sectional view for explaining an exemplary structure of a resin multilayer device 800 according to an eighth embodiment of the present invention, when seen in a width direction of transmission lines. The resin multilayer device 800 according to the eighth embodiment is a WLP, including: a substrate 10; a GND layer 16; a first resin layer 20; a first balanced signal transmission line 30 and a second balanced signal transmission line 35; a second resin layer 40; a single, unbalanced signal transmission line 50; and a third resin layer 60.

The eighth embodiment is different from the first embodiment in that the first balanced signal transmission line 30 and the second balanced signal transmission line 35 are arranged displaced from the unbalanced signal transmission line 50 to as to be less overlapped with each other. As a result, the width of the interconnection lines can be made larger without decreasing impedance. Therefore, it is possible to suppress the loss of the balun.

Furthermore, the manufacturing method of the first balanced signal transmission line 30 and the second balanced signal transmission line 35 is similar to that in the sixth embodiment or the seventh embodiment. Recess portions are fabricated. Then, the first balanced signal transmission line 30 and the second balanced signal transmission line 35 are formed therein. As a result, it is possible to accurately manufacture an offset stack.

For example, if the resin layer has a relative permittivity of Er=2.9, the first balanced signal transmission line 30 and the second balanced signal transmission line 35 have a width of W=30 μm, the first resin layer has a height of h1=10 μm, the second resin layer has a height of d=8 μm, the first balanced signal transmission line 30 and the second balanced signal transmission line 35 have a thickness of t=5 μm, then it is possible to fabricate a balun with an input of 50 ohm.

Ninth Embodiment

Figure 36:
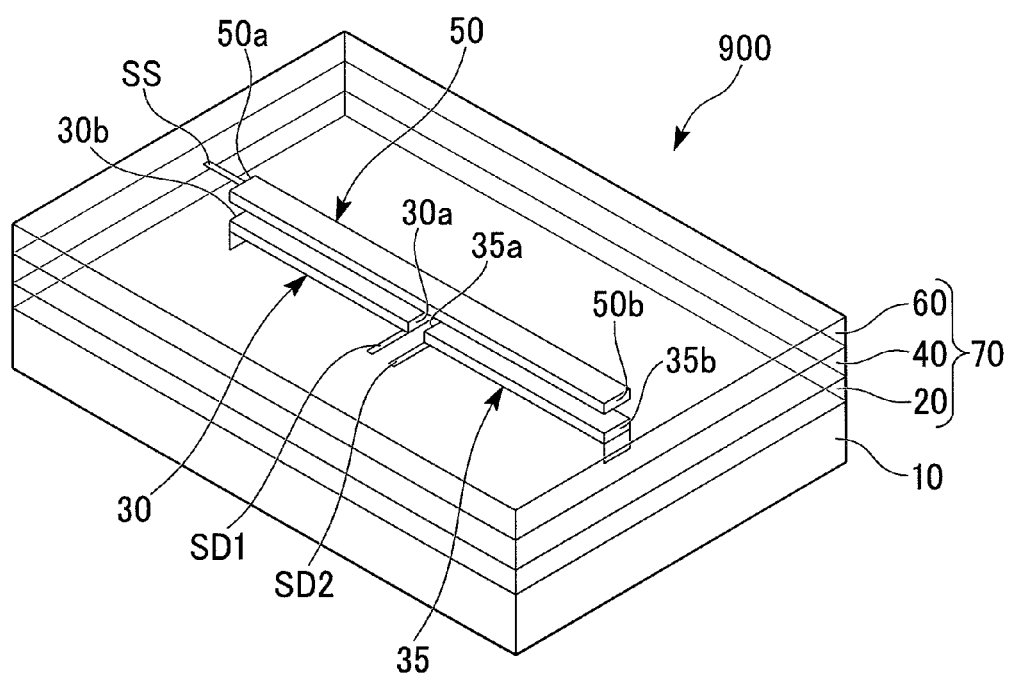
FIG. 36 is a perspective view schematically showing an exemplary structure of a resin multilayer device according to a ninth embodiment of the present invention.
Figure 37:
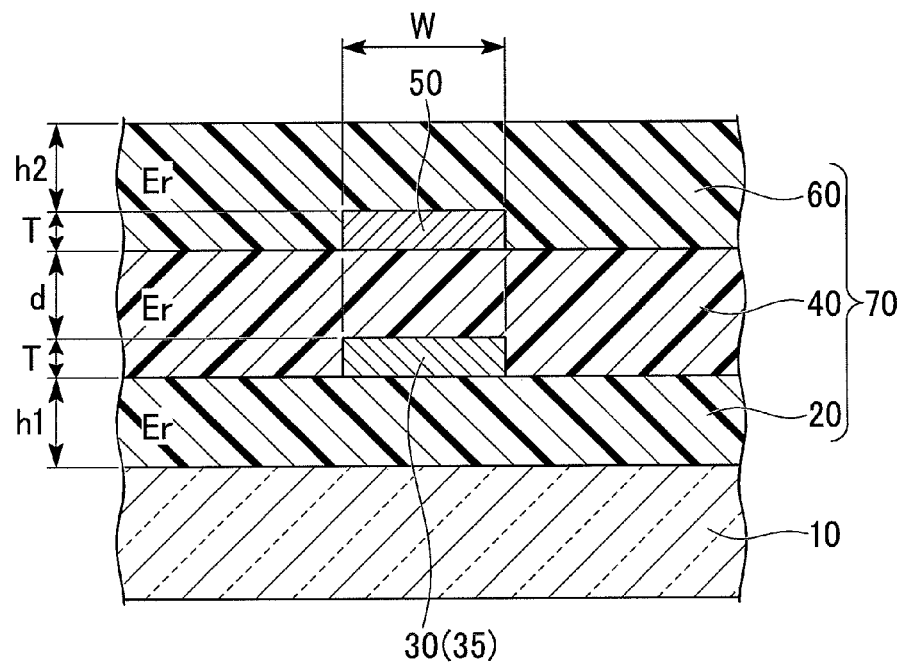
FIG. 37 is a cross-sectional view showing the resin multilayer device of FIG. 36, when seen in a width direction of transmission lines.
Figure 38:
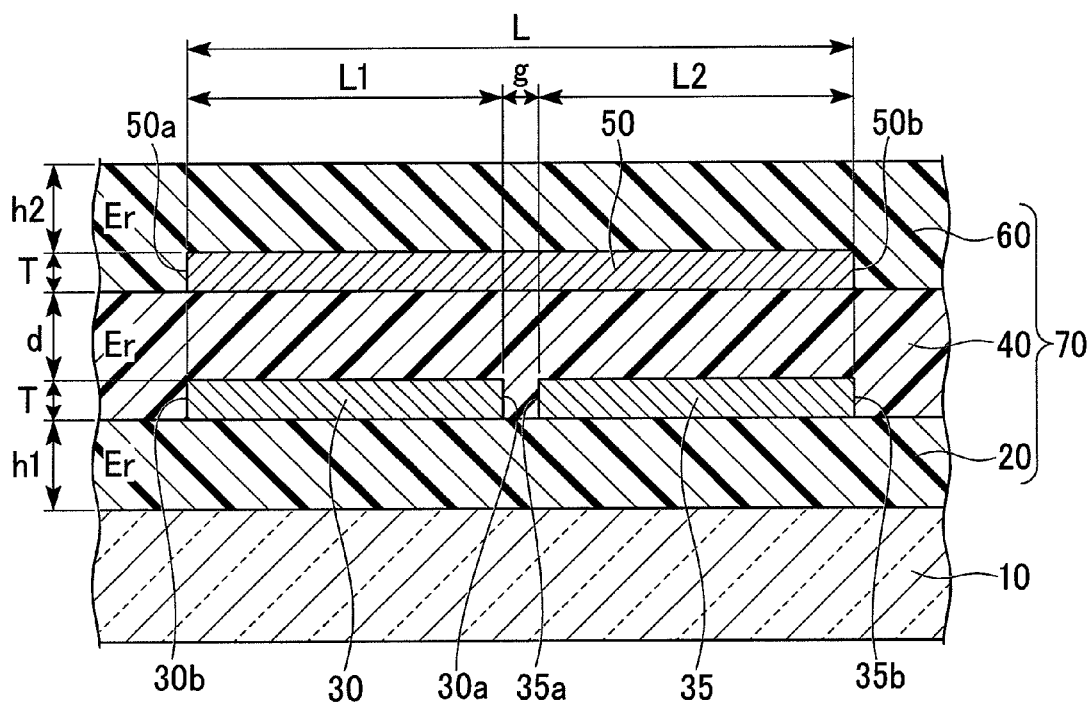
FIG. 38 is a cross-sectional view showing the resin multilayer device of FIG. 36, when seen in a length direction of the transmission lines.

FIG. 36 is a perspective view schematically showing an exemplary structure of a resin multilayer device 900 according to a ninth embodiment of the present invention. FIG. 37 is a cross-sectional view of the resin multilayer device 900, when seen in a width direction of transmission lines. FIG. 38 is a cross-sectional view of the resin multilayer device 900, when seen in a length direction of the transmission line.

The resin multilayer device 900 according to the ninth embodiment is a WLP, including: a substrate 10; a first resin layer 20; a first balanced signal transmission line 30; a second balanced signal transmission line 35; a second resin layer 40; a single unbalanced signal transmission line 50; and a third resin layer 60.

In the resin multilayer device 900, the first resin layer 20, the balanced signal transmission lines 30, 35, the second resin layer 40, the unbalanced signal transmission line 50, and the third resin layer 60 constitute a stack-type balun. Furthermore, the first resin layer 20, the second resin layer 40, and the third resin layer 60 constitute a multilayer resin body 70.
Substrate 10

The substrate 10 is, for example, a semiconductor substrate such as a silicon (Si) substrate, a glass substrate, or an insulative substrate such as a GaAs substrate. If an IC is fabricated in the substrate 10 by the CMOS semiconductor process or the like, the resin multilayer device 900 is a WLP in which a balun is made monolithic.
First Resin Layer 20, Second Resin Layer 40, and Third Resin Layer 60

For the first resin layer 20, a polyimide resin, an epoxy resin, a fluorine-based resin such as ethylene tetrafluoride, or a photosensitive resin such as BCB (benzocyclobutene) is used. The first balanced signal transmission line 30 and the second balanced signal transmission line 35 are formed on the first resin layer 20.

The second resin layer 40 is formed on the first resin layer 20. For the second resin layer 40, a polyimide resin, an epoxy resin, a fluorine-based resin such as ethylene tetrafluoride, or a photosensitive resin such as BCB (benzocyclobutene) is used. The unbalanced signal transmission line 50 is formed on the second resin layer 40.

The third resin layer 60 is formed on the second resin layer 40. For the third resin layer 60, a polyimide resin, an epoxy resin, a fluorine-based resin such as ethylene tetrafluoride, or a photosensitive resin such as BCB (benzocyclobutene) is used.

It is desirable that the first resin layer 20, the second resin layer 40, and the third resin layer 60 be formed to have the same relative permittivity Er by use of the same material and the same method or the like.
Balanced Signal Transmission Lines 30, 35, and Unbalanced Signal Transmission Line 50

The first balanced signal transmission line 30 and the second balanced signal transmission line 35 are formed on the first resin layer 20. The first balanced signal transmission line 30 is a straight transmission line without a bend and a curve. Similarly, the second balanced signal transmission line 35 is a straight transmission line without a bend and a curve. The first balanced signal transmission line 30 and the second balanced signal transmission line 35 are arranged so as to be coaxial in the longitudinal direction.

A first end 30a of the first balanced signal transmission line 30 and a first end 35a of the second balanced signal transmission line 35 face each other with a gap g (see FIG. 38). The first end 30a of the first balanced signal transmission line 30 and the first end 35a of the second balanced signal transmission line 35 are signal input/output ends for balanced signals (differential signals) SD1, SD2, respectively. A second end 30b of the first balanced signal transmission line 30 and a second end 35b of the second balanced signal transmission line 35 are ground ends (are connected to GND).

The first balanced signal transmission line 30 and the second balanced signal transmission line 35 are simultaneously formed with the same metal material, for example, a plated metal such as copper plating. Furthermore, it is desirable that a transmission line length L1 of the first balanced signal transmission line 30 and a transmission line length L2 of the second balanced signal transmission line 35 be formed so as to be the same (L1=L2).

Furthermore, it is desirable that the first balanced signal transmission line 30 and the second balanced signal transmission line 35 be formed so as to have the same width W and the same thickness T. Note that a distance between the upper surface of the substrate 10 and the lower surfaces of the first balanced signal transmission line 30 and the second balanced signal transmission line 35, namely, the thickness of the first resin layer 20, is denoted by h1 (see FIG. 37).

The unbalanced signal transmission line 50 is formed on the second resin layer 40. The unbalanced signal transmission line 50 is a straight transmission line without a bend and a curve, which is provided so as to be opposed to the upper surfaces of the first balanced signal transmission line 30 and the second balanced signal transmission line 35.

The first end 50a of the unbalanced signal transmission line 50 is a signal input/output end for an unbalanced signal SS. The second end 50b of the unbalanced signal transmission line 50 is an open end.

The unbalanced signal transmission line 50 is made of a plated metal such as copper plating. It is desirable that the unbalanced signal transmission line 50 be formed with the same metal material and by the same formation method as those for the first balanced signal transmission line 30 and the second balanced signal transmission line 35.

It is desirable that the unbalanced signal transmission line 50 be formed so that its length L is the same as the sum total of the transmission line length L1 of the balanced signal transmission line 30, the transmission line length L2 of the balanced signal transmission line 35, and the gap g between the signal input/output end 30a of the balanced signal transmission line 30 and the signal input/output end 35a of the balanced signal transmission line 35 (see FIG. 3). In general, the unbalanced signal transmission line 50 has the same width W and the same thickness T as those of the first balanced signal transmission line 30 and the second balanced signal transmission line 35. However, even if the two values are different to some degree, the operation of the balun itself is not affected (see FIG. 37).

Note that the distance between the lower surface of the unbalanced signal transmission line 50 and the upper surfaces of the first balanced signal transmission line 30 and the second balanced signal transmission line 35, which are arranged opposed to each other via the second resin layer 40, is denoted by d. The distance from the upper surface of the unbalanced signal transmission line 50 to the upper surface of the third resin layer 60 is denoted by h2 (see FIG. 37). The first resin layer 20, the second resin layer 40, and the third resin layer 60 may be different in thickness from one another. To be more specific, the first resin layer 20 may be thicker than the second resin layer 40, and the second resin layer 40 may be thicker than the third resin layer 60. The relation among a distance h1 between the lower surfaces of the first balanced signal transmission line 30 as well as the second balanced signal transmission line 35 and the upper surface of the substrate 10, a distance d between the lower surface of the unbalanced signal transmission line 50 and the upper surfaces of the first balanced signal transmission line 30 and the second balanced signal transmission line 35, and a distance h2 between the upper surface of the unbalanced signal transmission line 50 and the upper surface of the third resin layer 60 may be h1>d>h2.

Operation of Balun

Figure 39:
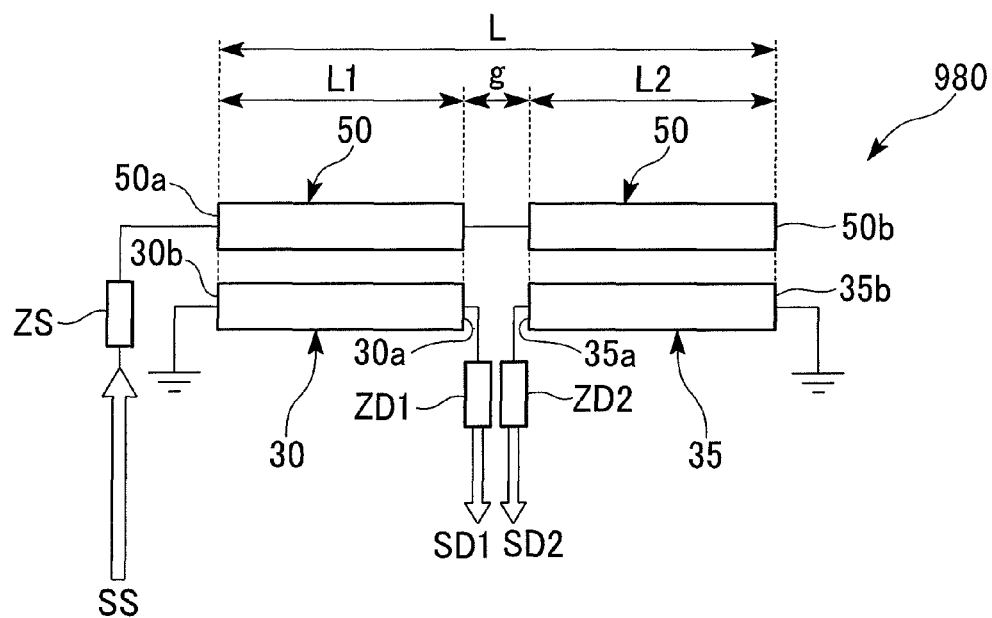
FIG. 39 is a schematic circuit diagram for explaining an operation of a stack-type balun formed in the resin multilayer device of FIG. 36.

FIG. 39 is a circuit diagram for explaining an operation of a stack-type balun 980 formed in the resin multilayer device 900. In FIG. 39, to a signal input/output end 50a of an unbalanced signal transmission line 50, an unbalanced signal (a single-ended signal) SS in input. From a signal input/output end 30a of the first balanced signal transmission line 30 and a signal input/output end 35a of the second balanced signal transmission line 35, balanced signals (differential signals) SD1, SD2 are output, respectively. A reference symbol ZS denotes an input impedance of the unbalanced signal transmission line 50. Reference symbols ZD1, ZD2 denote output impedances of balanced signal transmission lines 30, 35, respectively.

In FIG. 39, the balun 980 is a circuit in which the first balanced signal transmission line 30 and the second balanced signal transmission line 35 are arranged close to the unbalanced signal transmission line 50 via a second resin layer 40 (see FIG. 36), to thereby generate electromagnetic coupling between the first balanced signal transmission line 30 as well as the second balanced signal transmission line 35 and the unbalanced signal transmission line 50. When an unbalanced signal (a single-ended signal) SS is input to a signal input/output end 50a of the unbalanced signal transmission line 50, the balun 980 converts the unbalanced signal SS to balanced signals (differential signals) SD1, SD2, and outputs them from a signal input/output end 30a of the first balanced signal transmission line 30 and a signal input/output end 35a of the second balanced signal transmission line 35, respectively. Reversely to this, when balanced signals SD1, SD2 are input respectively to the signal input/output end 30a of the first balanced signal transmission line 30 and the signal input/output end 35a of the second balanced signal transmission line 35, the balun 80 converts the balanced signals SD1, SD2 to an unbalanced signal SS and outputs it from the signal input/output end 50a of the unbalanced signal transmission line 50.

Here, let the wavelength of the signal to be transmitted (the signal to be converted) be $\lambda$, the transmission lines 30, 35, and 50 are formed so that a transmission line length L1 of the balanced signal transmission line 30 and a transmission line length L2 of the balanced signal transmission line 35 are $\lambda/4$, and that a transmission line length formed by the portions of the unbalanced signal transmission line 50 along the first balanced signal transmission line 30 and the second balanced signal transmission line 35 (=L-g) is $\lambda/2$. Alternatively, the transmission lines 30, 35, and 50 may be formed so that L1=L2<$\lambda/4$, L-g$\lambda/2$, and the like.

Such a balun is an indispensable circuit in wireless telecommunication devices such as mobile phones that require conversion of unbalanced signals received by the antenna to balanced signals when the unbalanced signals are demodulated, and also require conversion of modulated signals, which are balanced signals, to unbalanced signals when the modulated signals are transmitted from the antenna.

In addition, the balun 980 of FIG. 39 also functions as a transformer that converts impedance values. For impedance conversion, the input impedance ZS on the unbalanced signal side (input side of single-ended signals), and the output impedances ZD1, ZD2 on the balanced signal side (output side of differential signal) are required to be impedance values conforming to the design specifications. For example, the input impedance value ZS=50$\Omega$ on the unbalanced signal side, and the output impedance values ZD1+ZD2=100, 150, 200$\Omega$ on the balanced signal side.

In the wireless telecommunication devices such as mobile phones, the input/output impedance value of the modem circuit and the output impedance value of the antenna do not always match each other. Therefore, also in order to match the impedance values of the two, the balun with a function of impedance conversion is indispensable. If no balun is inserted between the two or if the input/output impedance value is deviated from the design value of the balun even though a balun is inserted, there arises an inconvenience in which another impedance converter is required.

Manufacturing Procedure

Figure 40:
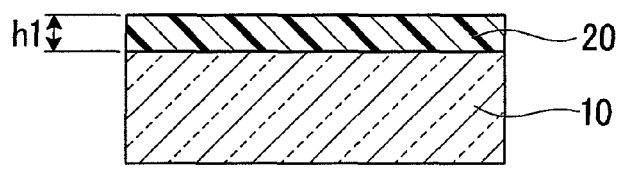
FIG. 40 is a cross-sectional view for explaining a manufacturing method of the resin multilayer device of FIG. 36 when seen in width direction of the transmission lines.
Figure 41:
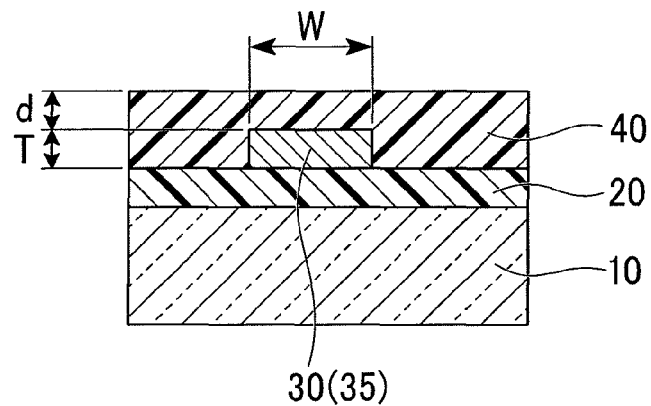
FIG. 41 is a cross-sectional view for explaining the manufacturing method of the resin multilayer device of FIG. 36 when seen in the width direction of the transmission lines.
Figure 42:
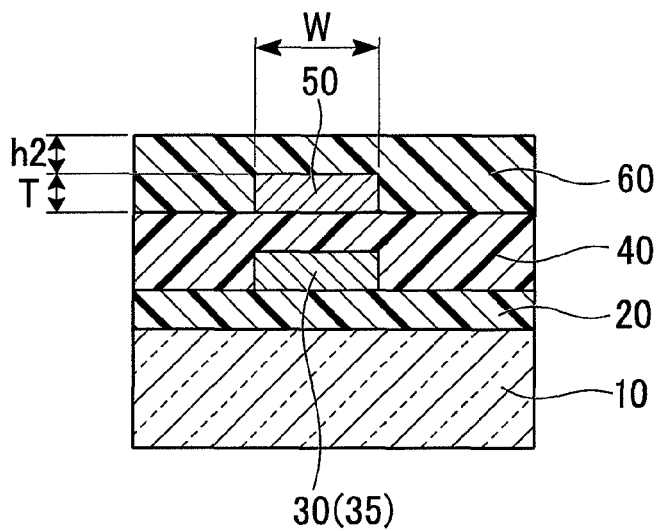
FIG. 42 is a cross-sectional view for explaining the manufacturing method of the resin multilayer device of FIG. 36 when seen in the width direction of the transmission lines.
Figure 43:
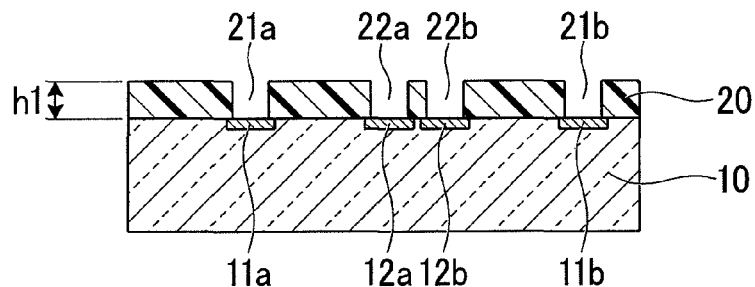
FIG. 43 is a cross-sectional view for explaining the manufacturing method of the resin multilayer device of FIG. 36, when seen in a length direction of the transmission lines.
Figure 44:
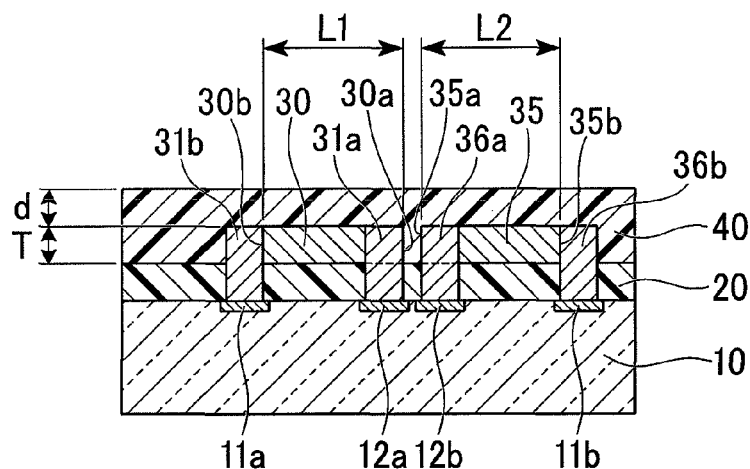
FIG. 44 is a cross-sectional view for explaining the manufacturing method of the resin multilayer device of FIG. 36, when seen in the length direction of the transmission lines.
Figure 45:
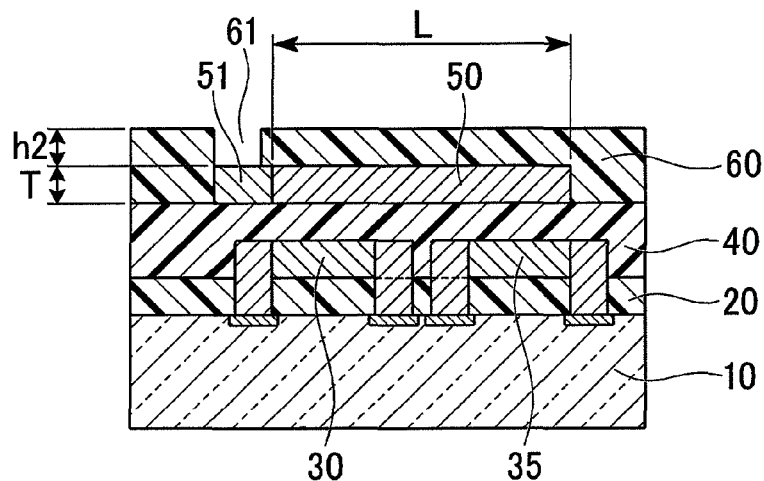
FIG. 45 is a cross-sectional view for explaining the manufacturing method of the resin multilayer device of FIG. 36, when seen in the length direction of the transmission lines.

FIG. 40 to FIG. 42 are cross-sectional views for explaining a manufacturing procedure of the resin multilayer device 900 when seen in a width direction of the transmission lines. FIG. 43 to FIG. 45 are cross-sectional views for explaining the manufacturing procedure of the resin multilayer device 900 when seen in a length direction of the transmission lines. However, FIG. 40 to FIG. 45 are for explaining a procedure of forming a balun on a substrate 10 out of the whole manufacturing procedure of the resin multilayer device 900.

In the following description, the substrate 10 is a silicon (Si) wafer in which an IC is fabricated by the CMOS process or the like. Because the resin multilayer device 900 is a WLP, a balun is formed by the WLCSP technology (the technology in which a redistribution layer is fabricated onto a wafer by the resin layer formation process and the formation process of interconnection lines such as thick copper interconnection lines, followed by being diced into chips).

First, as shown in FIG. 40 and FIG. 43, a first resin layer 20 is formed on the substrate 10, which is a silicon wafer. In the first resin layer 20, there are provided opening portions 21a, 21b that expose GND layers 11a, 11b of an IC fabricated in the substrate 10, and also opening portions 22a, 22b that expose balanced signal (differential signal) input pads 12a, 12b of the IC. For the first resin layer 20, a photosensitive insulative resin with a relative permittivity Er is used. A fluid resin material of the photosensitive resin is coated on the substrate 10 by the spin coating method, to thereby form a photosensitive resin layer with a thickness of h1. In the photosensitive resin layer, the opening portions 21a, 21b, 22a, and 22b are formed by the photolithography method.

Note that the opening portions 21a, 21b are for bringing a ground end 30b of a balanced signal transmission line 30 and a ground end 35b of a balanced signal transmission line 35 into contact with the GND layers 11a, 11b, respectively. In addition, the opening portions 22a, 22b are for bringing a signal input/output end 30a of the balanced signal transmission line 30 and a signal input/output end 35a of the balanced signal transmission line 35 into contact with the balanced signal (differential signal) input pads 12a, 12b of the IC, respectively.

Next, as shown in FIG. 41 and FIG. 44, a first balanced signal transmission line 30 and a second balanced signal transmission line 35 are formed on the first resin layer 20. For the first balanced signal transmission line 30 and the second balanced signal transmission line 35, copper plating is used. After formation of a seed layer on the first resin layer 20, a resist is formed, which is then patterned by the photolithography method and is subjected to copper plating. The copper-plated layer is patterned by the etching method, to thereby form the first balanced signal transmission line 30 with a width of W, a thickness of T, and a length of L1, and the second balanced signal transmission line 35 with a width of W, a thickness of T, and a length of L2 (=L1). Furthermore, there are formed: an interconnection line 31a for electrically connecting between the signal input/output end 30a of the first balanced signal transmission line 30 and the balanced signal input pad 12a; an interconnection line 31b for electrically connecting between the ground end 30b of the first balanced signal transmission line 30 and the GND layer 11a; an interconnection line 36a for electrically connecting between the signal input/output end 35a of the second balanced signal transmission line 35 and the balanced signal input pad 12b; and an interconnection line 36b for electrically connecting between the ground end 35b of the second balanced signal transmission line 35 of the GND layer 11b.

Next, on the first resin layer 20 provided with the first balanced signal transmission line 30 and the second balanced signal transmission line 35, a second resin layer 40 is formed. For the second resin layer 40, a photosensitive insulative resin with a relative permittivity Er which is the same as that of the first resin layer 20 is used. A fluid resin material of the photosensitive resin is coated, by the spin coating method, on the first resin layer 20 provided with the first balanced signal transmission line 30 and the second balanced signal transmission line 35, to thereby form a photosensitive resin layer with a thickness of d from the top surface of balanced signal transmission line 30 and the top surface of the balanced signal transmission line 35.

Next, as shown in FIG. 42 and FIG. 45, an unbalanced signal transmission line 50 is formed on the second resin layer 40. For the unbalanced signal transmission line 50, copper plating is used similarly to the first balanced signal transmission line 30 and the second balanced signal transmission line 35. After formation of a seed layer on the second resin layer 40, a resist is formed, which is then patterned by the photolithography method and is subjected to copper plating. The copper-plated layer is patterned by the etching method, to thereby form the unbalanced signal transmission line 50 with a width of W, a thickness of T, and a length of L, and an interconnection line 51 for electrically connecting a signal input/output end 50a of the unbalanced signal transmission line 50 to a package substrate and the like.

Next, on the second resin layer 40 provided with the unbalanced signal transmission line 50, a third resin layer 60 as a sealing resin layer is formed. In the third resin layer 60, an opening portion 61 to expose the interconnection line 51 is provided.

For the third resin layer 60, a photosensitive insulative resin with a relative permittivity Er which is the same as those of the first resin layer 20 and the second resin layer 40 is used. A fluid resin material of the photosensitive resin is coated, by the spin coating method, on the second resin layer 40 provided with the unbalanced signal transmission line 50, to thereby form a photosensitive resin layer with a thickness of h2 from the upper surface of the unbalanced signal transmission line 50. In the photosensitive resin layer, the opening portion 61 is provided by the photolithography method.

In the case of flip-chip-bounding the resin multilayer device 900, a solder bump for connecting the interconnection line 51 to a signal output pad of a substrate package or the like is provided in the opening portion 61. In the case of wire-bonding the resin multilayer device 900, it is preferable that a thin film of Ni/Au or Al be formed on the interconnection line 51.

After completion of the above procedure, the substrate 10, which is a silicon wafer, is diced to obtain WLP-type resin multilayer devices 900. It is preferable that the first balanced signal transmission line 30, the second balanced signal transmission line 35, and the unbalanced signal transmission line 50 be formed by bright-plating with copper. Other than by bright-plating with copper, they may also be formed by bright-plating with nickel (Ni), gold (Au), silver (Ag), or the like. Typically, at high signal frequencies, an electric current has a tendency to distribute itself within a conductor with the current density being largest near the surface of the conductor. This is called the skin effect. For example, with a signal at a frequency of 10 GHz, copper has a skin depth of 0.66 μm. With a signal in a millimeter band at a frequency of 60 GHz, copper has a skin depth of 0.27 μm. As a result, the presence of unevenness on the surface of the transmission line causes an electric current to flow along a path longer than the case of a flat surface. Therefore, the presence of unevenness on the surface of the transmission line increases the transmission loss of the balun. Use of bright plating, which is capable of make the surface of the transmission line flat, makes it possible to reduce the transmission loss of the balun.

As described above, according to the ninth embodiment, there is provided a WLP having a balun in which a first resin layer 20, a first balanced signal transmission line 30 and a second balanced signal transmission line 35, a second resin layer 40, an unbalanced signal transmission line 50, and a third resin layer 60 (a sealing resin layer 60) are stacked on a substrate 10 in this order. With the WLCSP technology, it is possible to form resin layers and low-resistant transmission lines by copper plating or the like with high accuracy similar to that of the CMOS semiconductor process technology. Therefore, it is possible to obtain a balun with a highly accurate input/output impedance and a low insertion loss. In addition, if an IC is formed in the substrate, it is possible to make the balun monolithic.

Furthermore, with the formation of a balun in a multilayer resin, it is possible to reduce the number of layers more than the case of manufacturing a balun by the LTCC technology, leading to easier manufacturing. In the resin multilayer device 900 of the ninth embodiment, the GND layer for grounding the ground end 30b of the first balanced signal transmission line 30 and the ground end 35b of the second balanced signal transmission line 35 is not provided in the device, but the ground ends 30b and 35b are connected to a GND layer of the IC fabricated in the substrate 10. Thus, with the structure without a GND layer for grounding the ground ends 30b and 35b, it is possible to obtain a less number of layers than in the conventional balun provided with a GND layer for grounding the ground end of the balanced signal transmission line. Furthermore, in conventional baluns with a structure that has a GND layer above and below the transmission lines, it is not possible to neglect a loss due to an influence from an eddy current generated in the GND layers by the signal transmitting along the transmission lines or from other causes. However, with the structure without a GND layer for grounding the ground ends 30b and 35b, it is possible to reduce a loss of a signal due to an influence on the transmission lines by the GND layers.

Furthermore, with the formation of the balun by use of a multilayer resin and transmission lines by copper plating, it is possible to make the balun lighter, increase its resistance to impact, and improve its ability to release heat.

Furthermore, in the case of using Si for the substrate, the balun can be made thinner by grinding the Si from its back surface. This allows the balun to be used as it is built in a substrate.

Modification 1 of Ninth Embodiment

Figure 46:
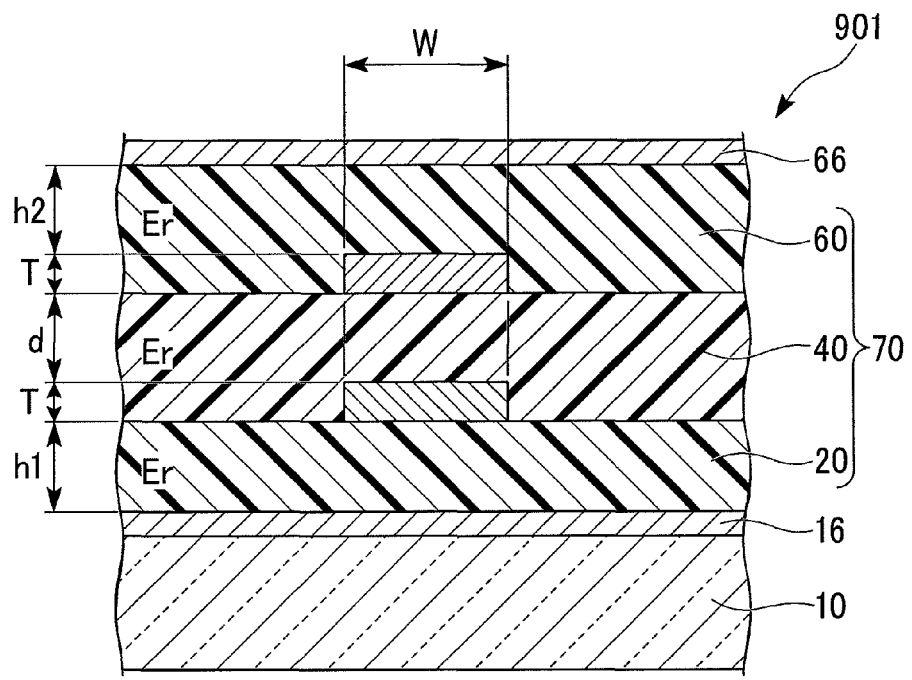
FIG. 46 is a cross-sectional view for explaining a modification 1 of the ninth embodiment of the resin multilayer device, when seen in a width direction of transmission lines.
Figure 47:
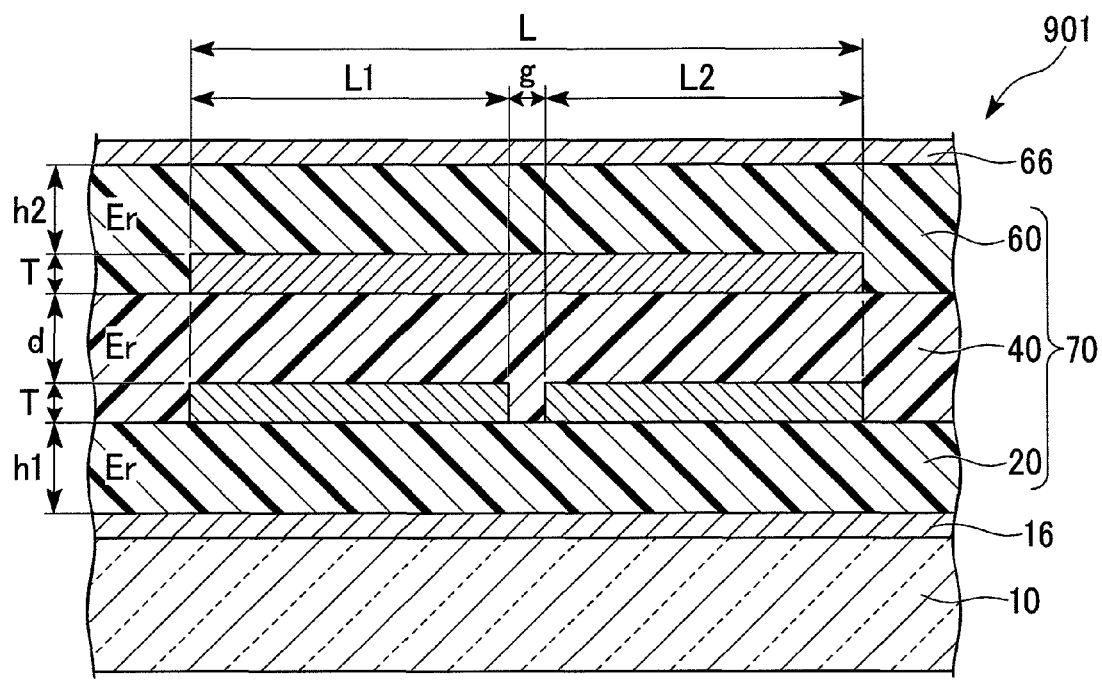
FIG. 47 is a cross-sectional view for explaining the modification 1 of the ninth embodiment of the resin multilayer device, when seen in a length direction of the transmission lines.

FIG. 46 is a cross-sectional view for explaining a resin multilayer device 901 of a modification 1 of the first embodiment, when seen in a width direction of transmission lines. FIG. 47 is a cross-sectional view for explaining the resin multilayer device 901 of the modification 1 of the ninth embodiment, when seen in a length direction of the transmission lines.

In FIG. 46 and FIG. 47, components the same as those of FIG. 36 to FIG. 45 are designated with the same reference symbols. The resin multilayer device 901 according to the modification 1 of the ninth embodiment is a WLP, including: a substrate 10; a first GND layer 16; a first resin layer 20; a first balanced signal transmission line 30 and a second balanced signal transmission line 35; a second resin layer 40; an unbalanced signal transmission line 50; a third resin layer 60; and a second GND layer 66.

The resin multilayer device 901 of FIG. 46 and FIG. 47 is one in which a first GND layer 16 is provided between the substrate 10 and the first resin layer 20, and also in which a second GND layer 66 is formed on the third resin layer 60 in the resin multilayer device 900 of the ninth embodiment (see FIG. 36 to FIG. 38).

The first GND layer 16 is formed of, for example, copper plating, an aluminum film, or a copper film. The second GND layer 66 is formed of, for example, copper plating, an aluminum film, or a copper film. In the case where the first GND layer 16 and the second GND layer 66 are allowed to be conducted to only either one of the GND of the substrate 10 and the GND of the substrate in which the resin multilayer device 901 is packaged, it is required that a conductive via hole be provided through the multilayer resin body 70 in order to connect between the first GND layer 16 and the second GND layer 66. This makes it possible to maintain the first GND layer 16 and the second GND layer 66 at the same potential. In the case of flip-chip-packaging the resin multilayer device, the first balanced signal transmission line 30, the second balanced signal transmission line 35, and the unbalanced signal transmission line 50 are surrounded from top and bottom by the first GND layer 16 and the second GND layer 66 in this manner. As a result, the characteristics of the balun are dependent on the electromagnetic field in the area surrounded by the first GND layer 16 and the second GND layer 66. Therefore, it is possible to reduce the influence from the substrate package and the influence from the circuit formed in the substrate 10, thus preventing the balun from being influence by the external environmental change.

Modification 2 of Ninth Embodiment

Figure 48:
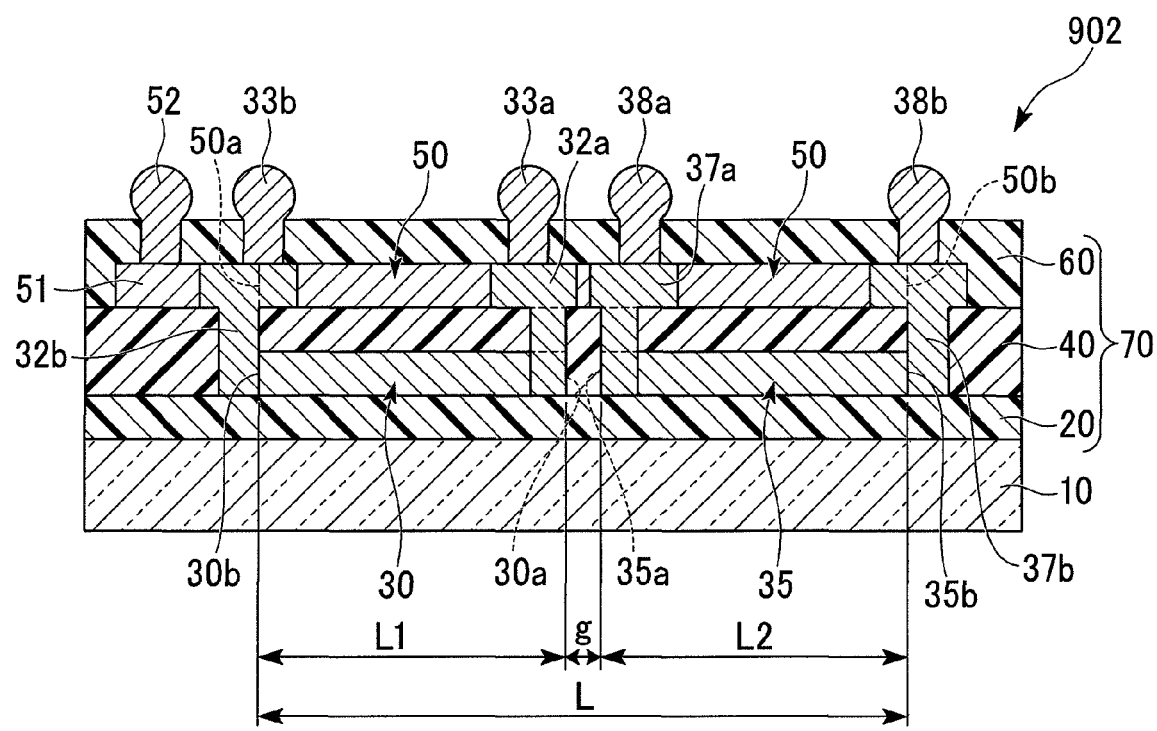
FIG. 48 is a cross-sectional view for explaining a modification 2 of the ninth embodiment of the resin multilayer device when seen in a length direction of transmission lines.

FIG. 48 is a cross-sectional view for explaining a resin multilayer device 902 of a modification 2 of the ninth embodiment, when seen in a length direction of transmission lines. In FIG. 48, components the same as those of FIG. 36 to FIG. 45 are designated with the same reference symbols. The resin multilayer device 902 according to the modification 2 of the ninth embodiment is a WLP, including: a substrate 10; a first resin layer 20; a first balanced signal transmission line 30 and a second balanced signal transmission line 35; a second resin layer 40; an unbalanced signal transmission line 50; a third resin layer 60; and solder bumps 33a, 33b, 38a, 38b, and 52.

The resin multilayer device 902 of FIG. 48 is one in which solder bumps 33a, 33b, 38a, 38b, and 52 for flip-chip packaging or for other purposes are provided in opening portions formed in the third resin layer 60 in the resin multilayer device 900 according to the ninth embodiment (FIG. 36 to FIG. 38).

The solder bump 33a is an input/output terminal for the balanced signal SD1 (see FIG. 36 or FIG. 39), and is connected to a signal input/output end 30a of the first balanced signal transmission line 30 via an interconnection line 32a. Similarly, the solder bump 38a is an input/output terminal for a balanced signal SD2 (see FIG. 36 or FIG. 39), and is connected to a signal input/output end 35a of the second balanced signal transmission line 35 via an interconnection line 37a. The solder bump 52 is connected to the signal input/output end 50a of the unbalanced signal transmission line 50 via the interconnection line 51.

The solder bump 33b is a ground terminal, and is connected to the ground end 30b of the first balanced signal transmission line 30 via the interconnection line 32b. Similarly, the solder bump 38b is a ground terminal, and is connected to the ground end 35b of the second balanced signal transmission line 35 via the interconnection line 37b.

Tenth Embodiment

Figure 49:
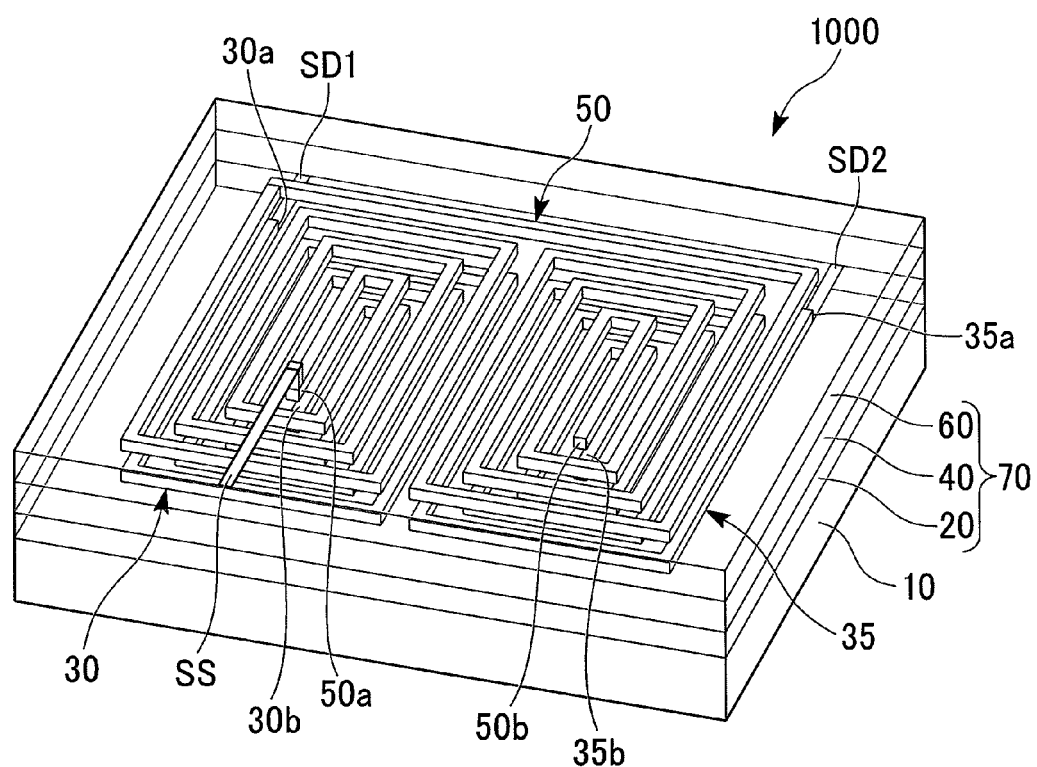
FIG. 49 is a cross-sectional view schematically showing an exemplary structure of a resin multilayer device according to a tenth embodiment of the present invention.

FIG. 49 is a perspective view schematically showing an exemplary structure of a resin multilayer device 1000 according to a tenth embodiment of the present invention. In FIG. 49, components the same as those of FIG. 36 are designated with the same reference symbols. The resin multilayer device 1000 according to the tenth embodiment is a WLP, including: a substrate 10; a first resin layer 20; a first balanced signal transmission line 30 and a second balanced signal transmission line 35 that are provided in a planar spiral shape; a second resin layer 40; an unbalanced signal transmission line 50 provided in a planar spiral shape; and a third resin layer 60.

Namely, the resin multilayer device 1000 according to the second embodiment shown in FIG. 49 is one in which the first balanced signal transmission line 30 and the second balanced signal transmission line 35, which are formed straight in the ninth embodiment (see FIG. 36), are made as a first balanced signal transmission line 30 and a second balanced signal transmission line 35 both with a spiral shape, and also in which the unbalanced signal transmission line 50, which is formed straight in the ninth embodiment (see FIG. 36), is accordingly made as a spiral-shaped unbalanced signal transmission line 50. Therefore, the spiral-shaped first balanced signal transmission line 30 and second balanced signal transmission line 35 are electromagnetically coupled to the spiral-shaped unbalanced signal transmission line 50 arranged opposed to the spiral-shaped first balanced signal transmission line 30 and second balanced signal transmission line 35, to thereby form a stack-type balun. Similarly to the ninth embodiment, the balun of the tenth embodiment is formed in a stack as transmission lines of copper plating or the like in a multilayer resin body 70 on the substrate 10.

If the first balanced signal transmission line 30, the second balanced signal transmission line 35, and the unbalanced signal transmission line 50 are shaped straight as is the case with the ninth embodiment, space is not required in the width direction of the transmission lines. But, in the length direction of the transmission lines, space with a transmission line length of the unbalanced signal transmission line 50 or longer is required. However, in applications to a some-GHz band, it is often difficult in actuality to find such long space on the resin multilayer device.

Therefore, in the tenth embodiment, the first balanced signal transmission line 30, the second balanced signal transmission line 35, and the unbalanced signal transmission line 50 are provided in a spiral shape. This allows the first balanced signal transmission line 30, the second balanced signal transmission line 35, and the unbalanced signal transmission line 50 with a long transmission line length to be arranged in narrow space with a shape such as a square or an ellipse. Therefore, with the spiral-shaped configuration, it is possible to provide a balun with reduced occupation space and with long transmission lines.

A planar spiral by the first balanced signal transmission line 30 formed on the first resin layer 20 is referred to as a first spiral. Similarly, a planar spiral by the second balanced signal transmission line 35 formed on the first resin layer 20 is referred to as a second spiral. The unbalanced signal transmission line 50 formed on the second resin layer 40 is formed as a single transmission line that draws two spirals along the first and second spirals.

In the first spiral, an outer circumferential end of the first balanced signal transmission line 30 is a signal input/output end 30*a* for a balanced signal SD1, and an inner circumferential end of the first balanced signal transmission line 30 is a ground end 30*b*.

The first spiral is a spiral curving clockwise from its inner circumferential end to its outer circumferential end when seen from the top side of the resin multilayer device 1000.

Similarly, in the second spiral, an outer circumferential end of the second balanced signal transmission line 35 is a signal input/output end 35*a* for a balanced signal SD2, and an inner circumferential end of the second balanced signal transmission line 35 for a ground end 35*b*. The second spiral is a spiral curving counterclockwise from its inner circumferential end to its outer circumferential end when seen from the top side of the resin multilayer device 1000. However, when seen from the top side of the resin multilayer device 1000, the first spiral may form a spiral curving counterclockwise from its inner circumferential end to its outer circumferential end, and the second spiral may form a spiral curving clockwise from its inner circumferential end to its outer circumferential end.

The spiral-shaped unbalanced signal transmission line 50 is formed clockwise from an inner circumferential end to an outer circumferential end along the part corresponding to the first spiral so as to be opposed to the first balanced signal transmission line 30, and is formed counterclockwise from an inner circumferential end to an outer circumferential end along the part corresponding to the second spiral so as to be opposed to the second balanced signal transmission line 35. The outer circumferential end of the first spiral and the outer circumferential end of the second spiral are coupled to form a single transmission line. The inner circumferential end on the first spiral side of the unbalanced signal transmission line 50 is a signal input/output end 50*a* for an unbalanced signal SS. The inner circumferential end on the second spiral side of the unbalanced signal transmission line 50 is an open end 50*b*. Note that, when seen from the top side of the resin multilayer device 1000, the unbalanced signal transmission line 50 may form, in the first spiral, a counterclockwise spiral curving from the inner circumferential end to the outer circumferential end so as to be opposed to the balanced signal transmission line 30 and may form, in the second spiral, a clockwise spiral curving from the inner circumferential end to the outer circumferential end so as to be opposed to the balanced signal transmission line 35.

As described above, according to the tenth embodiment, the advantage similar to that of the ninth embodiment is obtained. In addition, with the transmission lines that form the balun being provided as a spiral shape, it is possible to reduce the space occupied by the balun while making the transmission lines longer.

Note that the manufacturing procedure of the resin multilayer device 1000 of the tenth embodiment is similar to that of the ninth embodiment.

Eleventh Embodiment

Figure 50:
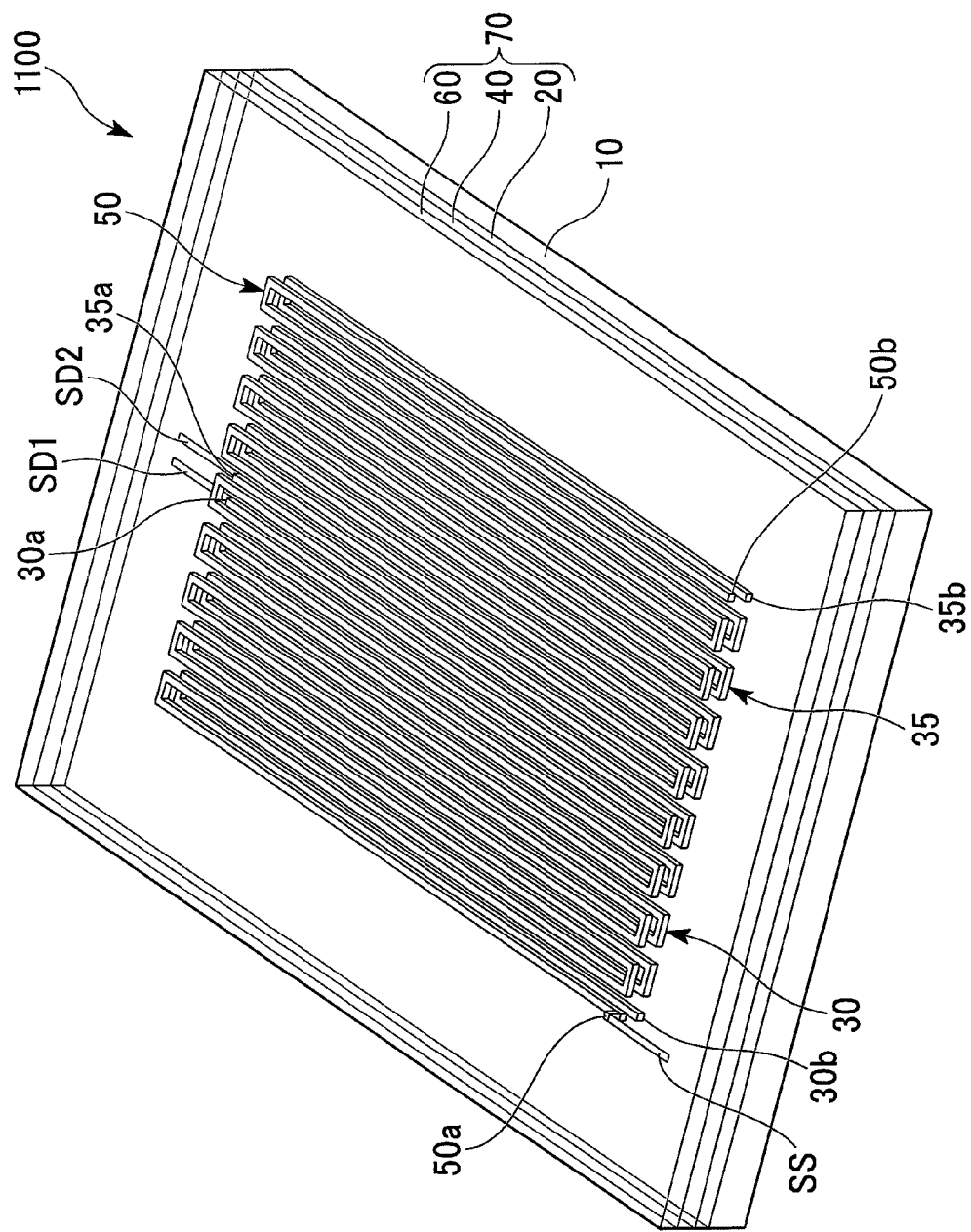
FIG. 50 is a cross-sectional view schematically showing an exemplary structure of a resin multilayer device according to an eleventh embodiment of the present invention.

FIG. 50 is a perspective view schematically showing an exemplary structure of a resin multilayer device 1100 according to an eleventh embodiment of the present invention. In FIG. 50, components the same as those of FIG. 36 are designated with the same reference symbols. The resin multilayer device 1100 according to the eleventh embodiment is a WLP, including: a substrate 10; a first resin layer 20; a first balanced signal transmission line 30 and a second balanced signal transmission line 35 that are provided in a meander shape; a second resin layer 40; an unbalanced signal transmission line 50; and a third resin layer 60.

Namely, the resin multilayer device 1100 according to the eleventh embodiment of FIG. 50 is one in which the first balanced signal transmission line 30 and the second balanced signal transmission line 35, which are formed straight in the ninth embodiment (see FIG. 36), are respectively made as a first balanced signal transmission line 30 and a second balanced signal transmission line 35 that have a meander shape, and also the unbalanced signal transmission line 50, which is formed straight in the ninth embodiment (FIG. 36) is accordingly made as a unbalanced signal transmission line 50 with a meander shape. Therefore, the meander-shaped first balanced signal transmission line 30 and the meander-shaped second balanced signal transmission line 35 are electromagnetically coupled to the meander-shaped unbalanced signal transmission line 50 arranged facing the meander-shaped first balanced signal transmission line 30 and the meander-shaped second balanced signal transmission line 35, to thereby form a stack-type balun. Similarly to the ninth embodiment, the balun of the eleventh embodiment is formed in a stack as transmission lines of copper plating or the like in a multilayer resin body 70 on the substrate 10.

If the first balanced signal transmission line 30, the second balanced signal transmission line 35, and the unbalanced signal transmission line 50 are shaped straight as is the case with the ninth embodiment, space is not required in the width direction of the transmission lines. But, in the length direction of the transmission lines, space with a transmission line length of the unbalanced signal transmission line 50 or longer is required. However, in applications to a some-GHz band, it is often difficult in actuality to find such long space on the resin multilayer device.

Therefore, in the eleventh embodiment, the ninth balanced signal transmission line 30, the second balanced signal transmission line 35, and the unbalanced signal transmission line 50 are provided in a meander shape. This allows the first balanced signal transmission line 30, the second balanced signal transmission line 35, and the unbalanced signal transmission line 50 with a long transmission line length to be arranged in narrow space with a shape such as a square. Therefore, with the meander-shaped configuration, it is possible to provide a balun with reduced occupation space and with long transmission lines.

The meander formed by the first balanced signal transmission line 30 formed on the first resin layer 20 is referred to as a first meander. Similarly, the meander that is formed by the second balanced signal transmission line 35 formed on the first resin layer 20 and is arranged adjacent to the first meander, is referred to as a second meander. The unbalanced signal transmission line 50 formed on the second resin layer 40 is formed as a single transmission line as if by drawing a single meander along the first and second meanders.

In the first meander, an end of the transmission line of the first balanced signal transmission line 30 that is positioned at the corner on the side adjacent to the second meander is a signal input/output end 30a for a balanced signal SD1, and an end of the transmission line of the first balanced signal transmission line 30 that is positioned at the corner on the side not adjacent to the second meander is a ground end 30b.

Similarly, in the second meander, an end of the transmission line of the second balanced signal transmission line 35 that is positioned at the corner on the side adjacent to the first meander is a signal input/output end 35a for a balanced signal SD2, and an end of the transmission line of the second balanced signal transmission line 35 that is positioned at the corner on the side not adjacent to the first meander is a ground end 35b.

The meander-shaped unbalanced signal transmission line 50 is formed as a single meander-shaped transmission line, along the area on the second resin layer 40 that is opposed to the areas of the first meander and the second meander on the first resin layer 20, so as to be opposed to the first balanced signal transmission line 30 and the second balanced signal transmission line 35. The end of the transmission line of the unbalanced signal transmission line 50 positioned above the area of the first meander is a signal input/output end 50a for an unbalanced signal SS, and the end of the transmission line of the unbalanced signal transmission line 50 positioned above the area of the second meander is an open end 50b.

As described above, according to the eleventh embodiment, the advantage similar to that of the ninth embodiment is obtained. In addition, with the transmission lines that form the balun being provided in meander shapes, it is possible to reduce the space occupied by the balun while making the transmission lines longer.

Note that the manufacturing procedure of the resin multilayer device 1100 of the eleventh embodiment is similar to that of the ninth embodiment.

In the resin multilayer device according to the present invention, the interconnection lines, the resist patterning for via pad formation, and the via holes in the dielectric body may all be formed by the photolithography technique.

In the above description of the embodiments of the present invention, the unbalanced signal transmission line is formed on the upper side of the balanced signal transmission lines via the resin layer. However, conversely to this, the balanced signal transmission lines may be formed on the upper side, and the unbalanced signal transmission line may be formed on the lower side.

Results of First Simulation

Results of a first simulation related to the resin multilayer device 100 according to the first embodiment will be described. On a silicon substrate 10 with a thickness of 300 μm, a GND layer 16, a first resin layer 20, a first balanced signal transmission line 30 and a second balanced signal transmission line 35, a second resin layer 40, an unbalanced signal transmission line 50, and a third resin layer 60 were stacked.

For the first resin layer 20, the second resin layer 40, and the third resin layer 60, a polyimide-based resin with a relative permittivity of Er=2.9 was used. In addition, the first balanced signal transmission line 30, the second balanced signal transmission line 35, and the unbalanced signal transmission line 50 were made of copper.

The first balanced signal transmission line 30, the second balanced signal transmission line 35, and the unbalanced signal transmission line 50 had a width of W=25 μm, and a thickness of T=5 μm. In addition, the first balanced signal transmission line 30 and the second balanced signal transmission line 35 had a length of L1=L2=5.4 mm. The gap between the first balanced signal transmission line 30 and the second balanced signal transmission line 35 was g=50 μm. The unbalanced signal transmission line 50 had a length of L=10.85 mm.

Figure 51:
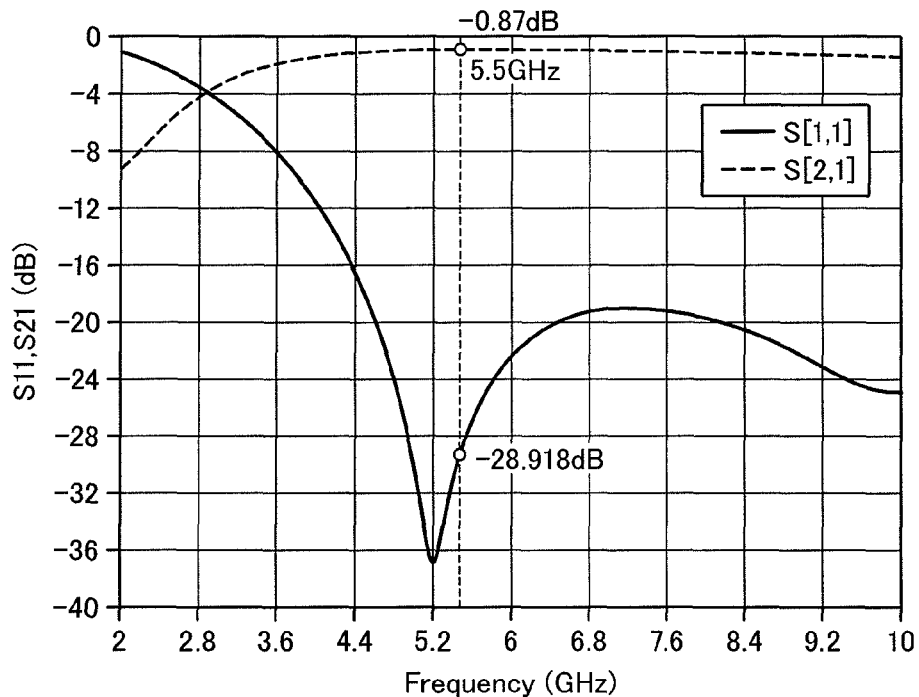
FIG. 51 is a graph showing transmission characteristics and reflection characteristics of the result of a first simulation.

The distance between the upper surface of the substrate and the lower surfaces of the first balanced signal transmission line 30 and the second balanced signal transmission line 35 (the thickness of the first resin layer 20) was h1=10 μm. The distance between the lower surface of the unbalanced signal transmission line 50 and the upper surfaces of the first balanced signal transmission line 30 and the second balanced signal transmission line 35 was d=8 μm. The distance between the upper surface of the unbalanced signal transmission line 50 and the upper surface of the third resin layer 60 was h2=6 μm. FIG. 51 is a graph showing the transmission characteristics and the reflection characteristics of the results of the first simulation.

Results of Second Simulation

Results of a second simulation related to the resin multilayer device 100 according to the first embodiment will be described. On a silicon substrate 10 with a thickness of 300 μm, a GND layer 16, a first resin layer 20, a first balanced signal transmission line 30 and a second balanced signal transmission line 35, a second resin layer 40, an unbalanced signal transmission line 50, and a third resin layer 60 were stacked.

For the first resin layer 20, the second resin layer 40, and the third resin layer 60, a polyimide-based resin with a relative permittivity of Er=2.7 was used. In addition, the first balanced signal transmission line 30, the second balanced signal transmission line 35, and the unbalanced signal transmission line 50 were made of copper.

The first balanced signal transmission line 30, the second balanced signal transmission line 35, and the unbalanced signal transmission line 50 had a width of W=22.5 μm, and a thickness of T=2 μm. In addition, the first balanced signal transmission line 30 and the second balanced signal transmission line 35 had a length of L1=L2=730 μm. The gap between the first balanced signal transmission line 30 and the second balanced signal transmission line 35 was g=50 μm. The unbalanced signal transmission line 50 had a length of L=1.51 mm.

Figure 52:
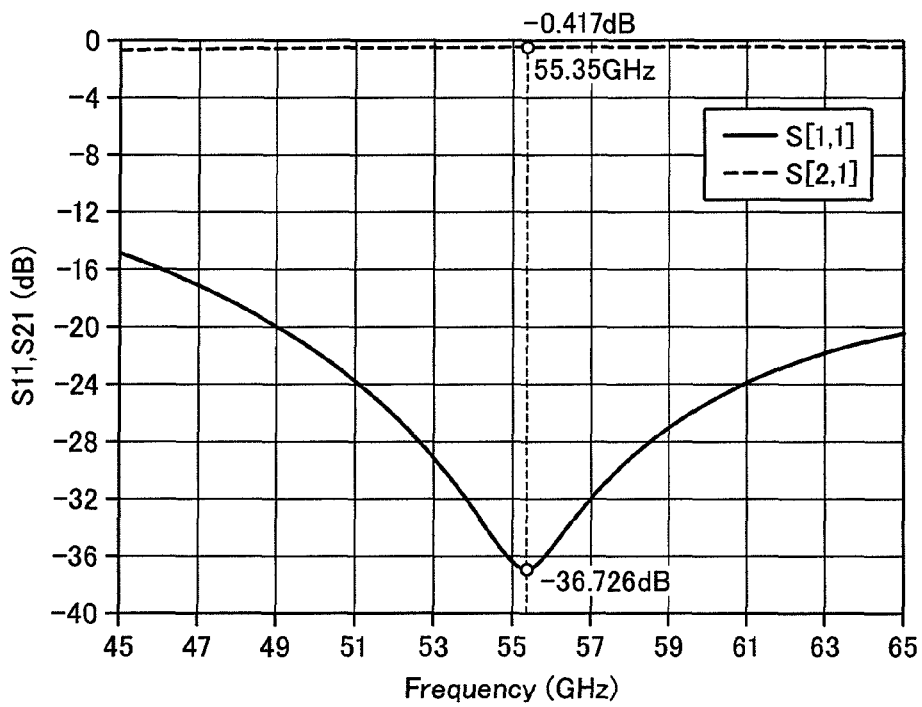
FIG. 52 is a graph showing transmission characteristics and reflection characteristics of the result of a second simulation.

The distance between the upper surface of the substrate and the lower surfaces of the first balanced signal transmission line 30 and the second balanced signal transmission line 35 (the thickness of the first resin layer 20) was h1=10 μm. The distance between the lower surface of the unbalanced signal transmission line 50 and the upper surfaces of the first balanced signal transmission line 30 and the second balanced signal transmission line 35 was d=8 μm. The distance between the upper surface of the unbalanced signal transmission line 50 and the upper surface of the third resin layer 60 was h2=6 μm. FIG. 52 is a graph showing the transmission characteristics and the reflection characteristics of the results of the second simulation.

Results of Third Simulation

A simulation related to the resin multilayer device 900 according to the ninth embodiment was performed. On a silicon substrate 10 with a thickness of 300 μm, a first resin layer 20, a first balanced signal transmission line 30 and a second balanced signal transmission line 35, a second resin layer 40, an unbalanced signal transmission line 50, and a third resin layer 60 were stacked.

For the first resin layer 20, the second resin layer 40, and the third resin layer 60, a polyimide-based resin with a relative permittivity of Er=3.2 was used. In addition, the first balanced signal transmission line 30, the second balanced signal transmission line 35, and the unbalanced signal transmission line 50 were made of copper.

The first balanced signal transmission line 30, the second balanced signal transmission line 35, and the unbalanced signal transmission line 50 had a width of W=17.5 µm, and a thickness of T=5 µm. In addition, the first balanced signal transmission line 30 and the second balanced signal transmission line 35 had a length of L1=L2=18 mm. The gap between the first balanced signal transmission line 30 and the second balanced signal transmission line 35 was g=40 µm. The unbalanced signal transmission line 50 had a length of L=36.04 mm.

The distance between the upper surface of the substrate and the lower surfaces of the first balanced signal transmission line 30 and the second balanced signal transmission line 35 (the thickness of the first resin layer 20) was h1=10 µm. The distance between the lower surface of the unbalanced signal transmission line 50 and the upper surfaces of the first balanced signal transmission line 30 and the second balanced signal transmission line 35 was d=8 µm. The distance between the upper surface of the unbalanced signal transmission line 50 and the upper surface of the third resin layer 60 was h2=6 µm.

The present invention is applicable to all the high-frequency circuits, and more particularly to circuits used in mobile phones and communication devices using wireless LAN, Bluetooth (registered trademark), WiMAX (registered trademark), near millimeter waves, millimeter waves, or the like.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A resin multilayer device comprising:
a substrate;
a first resin layer formed on the substrate;
a first balance signal transmission line and a second balanced signal transmission line that are formed electrically independently on the first resin layer;
a second resin layer formed on the first and second balanced signal transmission lines and the first resin layer;
an unbalanced signal transmission line formed on the second resin layer so as to be opposed to the first and second balanced signal transmission lines;
a third resin layer formed on the unbalanced signal transmission line and the second resin layer; and
a first GND layer that is formed on the substrate and is located beneath the first resin layer, wherein
the first balanced signal transmission line has a first signal input/output end and a first ground end,
the second balanced signal transmission line has a second signal input/output end and a second ground end,
the unbalanced signal transmission line has a signal input/output end and an open end,
the substrate is a semiconductor substrate in which an IC is fabricated, and
the ground ends of the first and second balanced signal transmission lines are connected to the first GND layer.

2. A resin multilayer device comprising:
a substrate;
a first resin layer formed on the substrate;
a first balanced signal transmission line and a second balanced signal transmission line that are formed electrically independently on the first resin layer;
a second resin layer formed on the first and second balanced signal transmission lines and the first resin layer;
an unbalanced signal transmission line formed on the second resin layer so as to be opposed to the first and second balanced signal transmission lines;
a third resin layer formed on the unbalanced signal transmission line and the second resin layer;
a first GND layer that is formed on the substrate and is located beneath the first resin layer;
a first, second, third, fourth, and fifth opening portions formed in the third resin layer;
a first solder bump that is formed in the first opening portion and is electrically connected to a first signal input/output end of the first balanced signal transmission line;
a second solder bump that is formed in the second opening portion and is electrically connected to a second signal input/output end of the second balanced signal transmission line;
a third solder bump that is formed in the third opening portion and is electrically connected to a third signal input/output end of the unbalanced signal transmission line;
a fourth solder bump that is formed in the fourth opening portion and is electrically connected to a first ground end of the first balanced signal transmission line; and
a fifth solder bump that is formed in the fifth opening portion and is electrically connected to a second ground end of the second balanced signal transmission line, wherein
the first balanced signal transmission line has the first signal input/output end and the first ground end,
the second balanced signal transmission line has the second signal input/output end and the second ground end, and
the unbalanced signal transmission line has a signal input/output end and an open end.

3. A resin multilayer device comprising: a substrate; a first resin layer formed on the substrate; a first balanced signal transmission line and a second balanced signal transmission line that are formed electrically independently on the first resin layer; a second resin layer formed on the first and second balanced signal transmission lines and the first resin layer; an unbalanced signal transmission line formed on the second resin layer so as to be opposed to the first and second balanced signal transmission lines; a third resin layer formed on the unbalanced signal transmission line and the second resin layer; and a first GND layer that is formed on the substrate and is located beneath the first resin layer, wherein the first balanced signal transmission line has a first signal input/output and a first ground end, the second balanced signal transmission line has a second signal input/output end and a second ground end, the unbalanced signal transmission line has a signal input/output end and an open end, and a window is formed in the first GND layer in a region above an inductor included in the substrate.

4. A resin multilayer device comprising:
a substrate;
a first resin layer formed on the substrate;

a first balanced signal transmission line and a second balanced signal transmission line that are formed electrically independently on the first resin layer;

a second resin layer formed on the first and second balanced signal transmission lines and the first resin layer;

an unbalanced signal transmission line formed on the second resin layer so as to be opposed to the first and second balanced signal transmission lines;

a third resin layer formed on the unbalanced signal transmission line and the second resin layer; and a first GND layer that is located beside the first and second balanced signal transmission lines and the unbalanced signal transmission line, wherein the first balanced signal transmission line has a first signal input/output end and a first ground end, the second balanced signal transmission line has a second signal input/output end and a second ground end, and the unbalanced signal transmission line has a signal input/output end and an open end.

5. The resin multilayer device according claim 4, further comprising a second GND layer that is formed on the third resin layer.

6. The resin multilayer device according to claim 4, wherein each of the first and second balanced signal transmission lines is arranged in a spiral shape.

7. The resin multilayer device according to claim 4, wherein each of the first and second balanced signal transmission lines is arranged in a meander shape.

8. A resin multilayer device comprising:
a substrate;
a first resin layer formed on the substrate;
a first balanced signal transmission line and a second balanced signal transmission line that are formed electrically independently on the first resin layer;
a second resin layer formed on the first and second balanced signal transmission lines and the first resin layer;
an unbalanced signal transmission line formed on the second resin layer so as to be opposed to the first and second balanced signal transmission lines;
a third resin layer formed on the unbalanced signal transmission line and the second resin layer; and
a first GND layer that is formed on the substrate and is located beneath the first resin layer, wherein
the first balanced signal transmission line has a first signal input/output end and a first ground end,
the second balanced signal transmission line has a second signal input/output end and a second ground end, and
the unbalanced signal transmission line is provided in a recess portion that is formed in the second resin layer.

9. A resin multilayer device comprising:
a substrate;
a first resin layer formed on the substrate;
a first balanced signal transmission line and a second balanced signal transmission line that are formed electrically independently on the first resin layer;
a second resin layer formed on the first and second balanced signal transmission lines and the first resin layer;
an unbalanced signal transmission line formed on the second resin layer so as to be opposed to the first and second balanced signal transmission lines; and
a third resin layer formed on the unbalanced signal transmission line and the second resin layer; wherein
the first balanced signal transmission line has a first signal input/output end and a first ground end,
the second balanced signal transmission line has a second signal input/output end and a second ground end,
the unbalanced signal transmission line has a signal input/output end and an open end,
the substrate is a semiconductor substrate in which an IC is fabricated, and
the ground ends of the first and second balanced signal transmission lines are electrically connected to a GND layer of the IC.

10. The resin multilayer device according to claim 9, further comprising
a first GND layer that is formed beneath the substrate.

11. The resin multilayer device according to claim 9, wherein
each of the first and second balanced signal transmission lines is arranged in a meander shape.

12. The resin multilayer device according to claim 9, wherein
each of the first and second balanced signal transmission lines is arranged in a meander shape.

13. A resin multilayer device comprising: a substrate; a first resin layer formed on the substrate; a first balanced signal transmission line and a second balanced signal transmission line that are formed electrically independently on the first resin layer; a second resin layer formed on the first and second balanced signal transmission lines and the first resin layer; an unbalanced signal transmission line formed on the second resin layer so as to be opposed to the first and second balanced signal transmission lines; a third resin layer formed on the unbalanced signal transmission line and the second resin layer; and a first GND layer that is formed on the substrate and is located beneath the first resin layer, wherein the first balanced signal transmission line has a first signal input/output end and a first ground end, the second balanced signal transmission line has a second signal input/output end and a second ground end, the unbalanced signal transmission line has a signal input/output end and an open end, and the first and second balanced signal transmission lines are provided in recess portions that are formed in the first resin layer.

14. The resin multilayer device to claim 13, wherein
The unbalanced signal transmission line is arranged so as to have less overlapped area with the first and second balanced signal transmission lines.

* * * * *